(12) United States Patent  
Kozuma et al.

(10) Patent No.: US 9,225,329 B2  
(45) Date of Patent: Dec. 29, 2015

(54) SEMICONDUCTOR DEVICE, DRIVING METHOD THEREOF, AND ELECTRONIC APPLIANCE

(71) Applicant: Semiconductor Energy Laboratory Co., Ltd., Atsugi-shi, Kanagawa-ken (JP)

(72) Inventors: Munehiro Kozuma, Kanagawa (JP); Takayuki Ikeda, Kanagawa (JP); Yoshiyuki Kurokawa, Kanagawa (JP); Takeshi Aoki, Kanagawa (JP); Takashi Nakagawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/635,087

(22) Filed: Mar. 2, 2015

(65) Prior Publication Data

US 2015/0256177 A1    Sep. 10, 2015

(30) Foreign Application Priority Data

Mar. 7, 2014 (JP) .................................. 2014-044810

(51) Int. Cl.  
*H03K 19/17* (2006.01)  
*G11C 14/00* (2006.01)  
*H03K 19/00* (2006.01)  
(Continued)

(52) U.S. Cl.  
CPC ............. *H03K 19/0008* (2013.01); *G06F 1/16* (2013.01); *H01L 27/1207* (2013.01); *H01L 29/7869* (2013.01); *H03K 19/1776* (2013.01)

(58) Field of Classification Search  
CPC ...................................................... H03K 17/24  
See application file for complete search history.

(56) References Cited

U.S. PATENT DOCUMENTS 3,775,693 A    11/1973    Proebsting  
4,797,576 A     1/1989    Asazawa  
(Continued)

FOREIGN PATENT DOCUMENTS

EP    1737044 A    12/2006  
EP    2226847 A     9/2010  
(Continued)

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

(Continued)

*Primary Examiner* — Alexander H Taningco  
*Assistant Examiner* — Nelson Correa  
(74) *Attorney, Agent, or Firm* — Fish & Richardson P.C.

(57) ABSTRACT

A semiconductor device in which operation delay due to stop and restart of the supply of a power supply potential is suppressed is provided. Potentials corresponding to data held in first and second nodes while the supply of a power supply potential is continued are backed up in third and fourth nodes while the supply of the power supply potential is stopped. After the supply of the power supply potential is restarted, data are restored to the first and second nodes by utilizing a change in channel resistance of a transistor whose gate is electrically connected to the third or fourth node. Note that shoot-through current is suppressed at the time of data restoration by electrically disconnecting the power supply potential and the first or second node from each other.

8 Claims, 24 Drawing Sheets

(51) Int. Cl.
*H01L 29/786* (2006.01)
*H01L 27/12* (2006.01)
*H03K 19/177* (2006.01)
*G06F 1/16* (2006.01)

(56) References Cited

U.S. PATENT DOCUMENTS

| | | | |
|---|---|---|---|
| 4,800,303 | A | 1/1989 | Graham et al. |
| 4,809,225 | A | 2/1989 | Dimmler et al. |
| 5,039,883 | A | 8/1991 | On |
| 5,473,571 | A | 12/1995 | Shigematsu et al. |
| 5,731,856 | A | 3/1998 | Kim et al. |
| 5,744,864 | A | 4/1998 | Cillessen et al. |
| 5,936,879 | A | 8/1999 | Brouwer et al. |
| 5,980,092 | A | 11/1999 | Merryman et al. |
| 6,049,883 | A | 4/2000 | Tjandrasuwita |
| 6,078,194 | A | 6/2000 | Lee |
| 6,127,702 | A | 10/2000 | Yamazaki et al. |
| 6,204,695 | B1 | 3/2001 | Alfke et al. |
| 6,281,710 | B1 | 8/2001 | Poirier et al. |
| 6,294,274 | B1 | 9/2001 | Kawazoe et al. |
| 6,337,592 | B1 * | 1/2002 | Igarashi ............ 327/427 |
| 6,556,475 | B2 | 4/2003 | Yamazaki et al. |
| 6,563,174 | B2 | 5/2003 | Kawasaki et al. |
| 6,573,754 | B2 | 6/2003 | Menczigar et al. |
| 6,693,616 | B2 | 2/2004 | Koyama et al. |
| 6,727,522 | B1 | 4/2004 | Kawasaki et al. |
| 6,738,281 | B2 | 5/2004 | Yokozeki |
| 6,788,567 | B2 | 9/2004 | Fujimori |
| 6,909,411 | B1 | 6/2005 | Yamazaki et al. |
| 6,975,298 | B2 | 12/2005 | Koyama et al. |
| 7,019,999 | B1 | 3/2006 | Srinivasan et al. |
| 7,031,189 | B2 * | 4/2006 | Pascucci ............ 365/185.08 |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,076,748 | B2 | 7/2006 | Kapoor et al. |
| 7,102,909 | B2 * | 9/2006 | Koide ............ 365/145 |
| 7,105,868 | B2 | 9/2006 | Nause et al. |
| 7,151,511 | B2 | 12/2006 | Koyama |
| 7,158,157 | B2 | 1/2007 | Yamazaki et al. |
| 7,211,825 | B2 | 5/2007 | Shih et al. |
| 7,224,339 | B2 | 5/2007 | Koyama et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,471,580 | B2 * | 12/2008 | Henzler et al. ............ 365/207 |
| 7,501,293 | B2 | 3/2009 | Ito et al. |
| 7,557,801 | B2 | 7/2009 | Ozaki |
| 7,576,582 | B2 | 8/2009 | Lee et al. |
| 7,674,650 | B2 | 3/2010 | Akimoto et al. |
| 7,696,952 | B2 | 4/2010 | Kimura et al. |
| 7,732,819 | B2 | 6/2010 | Akimoto et al. |
| 7,863,627 | B2 | 1/2011 | Honda |
| 7,910,490 | B2 | 3/2011 | Akimoto et al. |
| 7,932,521 | B2 | 4/2011 | Akimoto et al. |
| 8,212,248 | B2 | 7/2012 | Itagaki et al. |
| 8,274,077 | B2 | 9/2012 | Akimoto et al. |
| 8,314,637 | B2 * | 11/2012 | Kato et al. ............ 326/102 |
| 8,362,538 | B2 | 1/2013 | Koyama et al. |
| 8,368,066 | B2 | 2/2013 | Yamazaki et al. |
| 8,410,838 | B2 | 4/2013 | Kato et al. |
| 8,432,187 | B2 | 4/2013 | Kato et al. |
| 8,446,171 | B2 | 5/2013 | Takahashi |
| 8,508,276 | B2 * | 8/2013 | Hatano ............ 327/217 |
| 8,605,490 | B2 | 12/2013 | Fackenthal |
| 8,619,464 | B1 | 12/2013 | Sinha et al. |
| 8,638,594 | B1 | 1/2014 | Sinha et al. |
| 8,675,382 | B2 | 3/2014 | Kurokawa |
| 8,717,806 | B2 * | 5/2014 | Kurokawa ............ 365/154 |
| 8,773,906 | B2 * | 7/2014 | Ohmaru ............ 365/185.08 |
| 8,792,275 | B2 * | 7/2014 | Shih et al. ............ 365/185.07 |
| 8,817,536 | B2 | 8/2014 | Scade et al. |
| 9,047,947 | B2 * | 6/2015 | Yoneda ............ 1/1 |
| 9,070,776 | B2 * | 6/2015 | Kobayashi ............ 1/1 |
| 2001/0046027 | A1 | 11/2001 | Tai et al. |
| 2002/0036529 | A1 | 3/2002 | Furusawa et al. |
| 2002/0056838 | A1 | 5/2002 | Ogawa |
| 2002/0074568 | A1 | 6/2002 | Yoshida et al. |
| 2002/0132454 | A1 | 9/2002 | Ohtsu et al. |
| 2003/0076282 | A1 | 4/2003 | Ikeda et al. |
| 2003/0122581 | A1 | 7/2003 | Inoue et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0038582 | A1 | 2/2006 | Peeters |
| 2006/0043377 | A1 | 3/2006 | Hoffman et al. |
| 2006/0091793 | A1 | 5/2006 | Baude et al. |
| 2006/0095975 | A1 | 5/2006 | Yamada et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0119394 | A1 | 6/2006 | Dronavalli |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0019460 | A1 | 1/2007 | Kang et al. |
| 2007/0024187 | A1 | 2/2007 | Shin et al. |
| 2007/0024318 | A1 | 2/2007 | Mamidipaka |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0126666 | A1 | 6/2007 | Yamazaki et al. |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0048744 | A1 | 2/2008 | Fukuoka |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0170028 | A1 | 7/2008 | Yoshida |
| 2008/0182358 | A1 | 7/2008 | Cowdery-Corvan et al. |
| 2008/0197414 | A1 | 8/2008 | Hoffman et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |

(56) References Cited

U.S. PATENT DOCUMENTS

| | | |
|---|---|---|
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0002044 A1 | 1/2009 | Kobayashi |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0019839 A1 | 1/2010 | Monden |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0148171 A1 | 6/2010 | Hayashi et al. |
| 2011/0102018 A1 | 5/2011 | Shionoiri et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0121878 A1 | 5/2011 | Kato et al. |
| 2011/0148463 A1 | 6/2011 | Kato et al. |
| 2011/0156024 A1 | 6/2011 | Koyama et al. |
| 2011/0163311 A1 | 7/2011 | Akimoto et al. |
| 2011/0176357 A1 | 7/2011 | Koyama et al. |
| 2011/0187410 A1 | 8/2011 | Kato et al. |
| 2011/0249487 A1 | 10/2011 | Saito et al. |
| 2012/0033510 A1 | 2/2012 | Nagatsuka et al. |
| 2012/0250397 A1 | 10/2012 | Ohmaru |
| 2012/0250407 A1 | 10/2012 | Kurokawa |
| 2012/0269013 A1 | 10/2012 | Matsuzaki |
| 2013/0057315 A1 | 3/2013 | Kato et al. |
| 2013/0127497 A1 | 5/2013 | Koyama |
| 2013/0135943 A1 | 5/2013 | Ohmaru |
| 2013/0207170 A1 | 8/2013 | Kurokawa |
| 2013/0222033 A1 | 8/2013 | Kato et al. |
| 2013/0285697 A1 | 10/2013 | Kurokawa |
| 2013/0286757 A1 | 10/2013 | Takemura |
| 2013/0314124 A1 | 11/2013 | Ikeda et al. |
| 2013/0314976 A1* | 11/2013 | Onuki .................... 365/149 |
| 2013/0321025 A1 | 12/2013 | Kurokawa et al. |
| 2014/0126271 A1 | 5/2014 | Aoki et al. |
| 2014/0368235 A1 | 12/2014 | Aoki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-078836 A | 3/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086010 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Naito.T et al., "World's first monolithic 3D-FPGA with TFT SRAM over 90nm 9 layer Cu CMOS", 2010 Symposium on VLSI Technology : Digest of Technical Papers, Jun. 15, 2010, pp. 219-220.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Song.I et al., "Short Channel Characteristics of Gallium—Indium—Zinc—Oxide Thin Film Transistors for Three-Dimensional Stacking Memory", IEEE Electron Devices Letters, Jun. 1, 2008, vol. 29, No. 6, pp. 549-552.

Yamazaki.S et al., "Research, Development, and Application of Crystalline Oxide Semiconductor", SID Digest '12 : SID International Symposium Digest of Technical Papers, Jun. 5, 2012, pp. 183-186.

Nishijima.T et al., "Low-power Display System Driven by Utilizing Technique Using Crystalline IGZO Transistor", SID Digest '12 : SID International Symposium Digest of Technical Papers, 2012, pp. 583-586.

Chun.K et al., "A 3T Gain Cell Embedded DRAM Utilizing Preferential Boosting for High Density and Low Power On-Die Caches", IEEE Journal of Solid-State Circuits, Jun. 1, 2011, vol. 26, No. 6, pp. 1495-1505.

Eslami.F et al., "Capacitive Boosting for FPGA Interconnection Networks", 21st International Conference on Field Programmable Logic and Applications, 2011, vol. 21, pp. 453-458.

Trimberger.S et al., "A Time-Multiplexed FPGA", FCCM 1997 (IEEE 5th Annual International Symposium on Field-Programmable Custom Computing Machines), Apr. 16, 1997, pp. 22-28.

Suzuki.D et al., "Design of a Process-Variation-Aware Nonvolatile MTJ-Based Lookup-Table Circuit", SSDM 2010 (Extended Abstracts of the 2010 International Conference on Solid State Devices and Materials), Sep. 22, 2010, pp. 1146-1147.

Suzuki.D et al., "Fabrication of a Nonvolatile Lookup-Table Circuit Chip Using Magneto/Semiconductor-Hybrid Structure for an Immediate-Power-Up Field Programmable Gate Array", 2009 Symposium on VLSI Circuits Digest of Technical Papers, Jun. 16, 2009, pp. 80-81.

Rahman.A et al., "Determination of Power Gating Granularity for FPGA Fabric", CICC 2006 :IEEE 2006 Custom Integrated Circuits Conference, Sep. 10, 2006, pp. 9-12, IEEE.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7. pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phy. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 252-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2004, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, andYb2Fe3O7 Types of Structures for Compounds in The In2O3 and Sc2O3—A2O3—BO Systems [A: Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 25, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 20, 2008, pp. 191-193.

Li.C et al., "Modulated Structures of Homologous Compounds InMO3(ZnO)m (M=In,Ga; m=Integer) Described by Four-Dimesional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., The phase relations in the In2O3—Ga2ZnO4—ZnO system at 1350° C., Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review B.), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosphical Magazine, 2001, vol. 81, No. 5, pp. 501-515.

Orita.M et al., "Mechanism of Electrical Conductivity of Transparent InGaZnO4", Phys. Rev. B (Physical Review B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM '09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered A12O3 Gate Insulator", Appl. Phys. Lett. (Applied Physics Letters) , Sep. 1, 2003, vol. 83, No. 9, 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

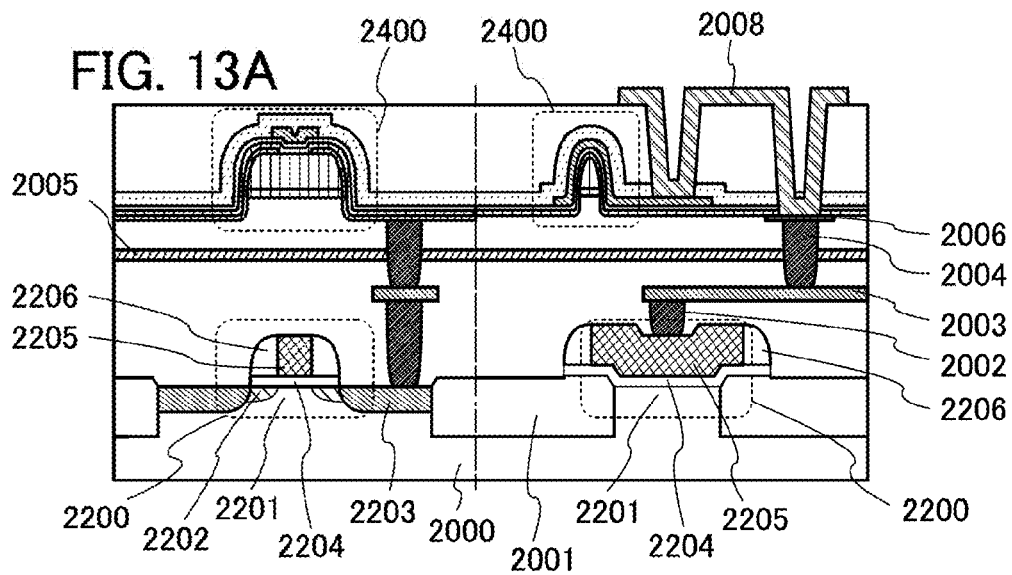
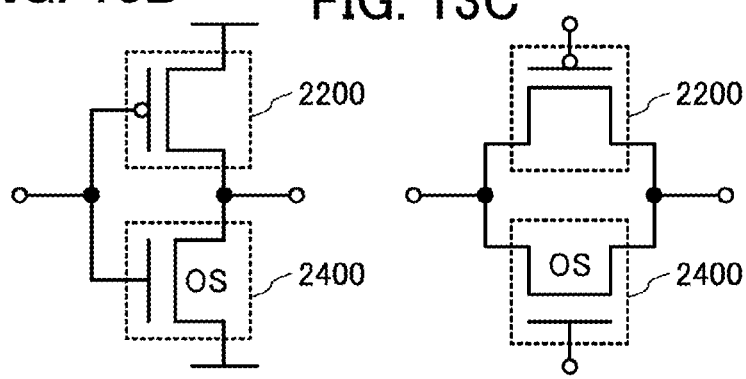
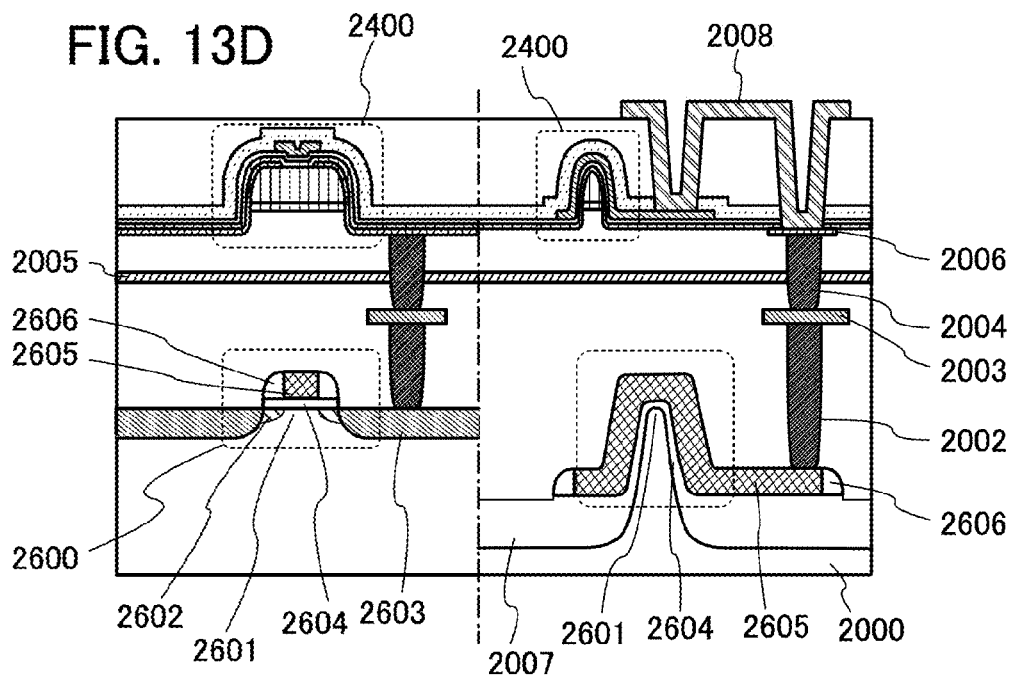

CAAC-OS nc-OS

□ non-CAAC ▩ CAAC as-sputtered

450°C heat treatment

SEMICONDUCTOR DEVICE, DRIVING METHOD THEREOF, AND ELECTRONIC APPLIANCE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a memory device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. A display device, an electro-optical device, a semiconductor circuit, and an electronic appliance include a semiconductor device in some cases.

2. Description of the Related Art

A semiconductor device such as a programmable logic device (PLD) or a central processing unit (CPU) has a variety of configurations depending on its application. The semiconductor device generally includes a memory device; the PLD includes a register and a configuration memory, and the CPU includes a register and a cache memory.

These memory devices need to operate at higher speed in writing and reading data than a main memory for which a DRAM is generally used. Thus, in many cases, a flip-flop is used as a register, and a static random access memory (SRAM) is used as a configuration memory and a cache memory.

The SRAM achieves high-speed operation with miniaturization of a transistor; however, there is a problem in that as the transistor is miniaturized, an increase in leakage current becomes obvious, which results in increased power consumption. In order to reduce power consumption, an attempt has been made to stop the supply of a power supply potential to a semiconductor device in a period during which data is not input or output, for example.

However, a flip-flop used as a register and an SRAM used as a cache memory are volatile memory devices. Therefore, in the case where the supply of a power supply potential to a semiconductor device is stopped, data that has been lost in a volatile memory device such as a register or a cache memory need to be restored after the supply of the power supply potential is restarted.

In view of this, a semiconductor device in which a nonvolatile memory device is located on the periphery of a volatile memory device has been developed. For example, Patent Document 1 discloses the following technique: data held in a flip-flop or the like is backed up in a ferroelectric memory before the supply of a power supply potential is stopped, and the data backed up in the ferroelectric memory is restored to the flip-flop or the like after the supply of the power supply potential is restarted.

[Patent Document 1] Japanese Published Patent Application No. H10-078836

SUMMARY OF THE INVENTION

An object of one embodiment of the present invention is to provide a semiconductor device with low power consumption. Another object of one embodiment of the present invention is to provide a method for driving a semiconductor device with low power consumption. Another object of one embodiment of the present invention is to provide a semiconductor device in which operation delay due to stop and restart of the supply of a power supply potential is suppressed. Another object of one embodiment of the present invention is to provide a method for driving a semiconductor device in which operation delay due to stop and restart of the supply of a power supply potential is suppressed. Another object of one embodiment of the present invention is to provide a novel semiconductor device and a method for driving the semiconductor device.

Note that the description of a plurality of objects does not preclude the existence of each object. One embodiment of the present invention does not necessarily achieve all the objects listed above. Objects other than those listed above are apparent from the description of the specification, drawings, and claims, and such objects could be an object of one embodiment of the present invention.

One embodiment of the present invention is a semiconductor device that includes first to third circuits. The first circuit includes first and second nodes, first and second transistors, and first and second wirings. The second circuit includes third to eighth transistors, third and fourth nodes, and a third wiring. The third circuit includes first and second NAND circuits and first and second inverter circuits. The first node has a function of holding one of a first potential and a second potential. The second node has a function of holding the other of the first potential and the second potential. The first transistor has a function of controlling electrical continuity between the second node and the first wiring. The second transistor has a function of controlling electrical continuity between the first node and the second wiring. The first and second wirings are supplied with the first potential. The first node is electrically connected to the third node via the third transistor. The first node is electrically connected to the third wiring via the seventh and eighth transistors. The second node is electrically connected to the fourth node via the sixth transistor. The second node is electrically connected to the third wiring via the fourth and fifth transistors. A gate of the fourth transistor is electrically connected to the third node. A gate of the seventh transistor is electrically connected to the fourth node. A first signal is input to a gate of the fifth transistor and a gate of the eighth transistor. The third wiring is supplied with the second potential. The first signal is input to a first input terminal of the first NAND circuit. A second input terminal of the first NAND circuit is electrically connected to the third node. An output terminal of the first NAND circuit is electrically connected to a gate of the first transistor via the first inverter circuit. The first signal is input to a first input terminal of the second NAND circuit. A second input terminal of the second NAND circuit is electrically connected to the fourth node. An output terminal of the second NAND circuit is electrically connected to a gate of the second transistor via the second inverter circuit. The third and sixth transistors each preferably include an oxide semiconductor in a channel formation region.

In the above-described embodiment, the third node has a function of holding a potential supplied to the first node while the supply of a power supply potential to the first to third circuits is stopped. The fourth node has a function of holding a potential supplied to the second node while the supply of the power supply potential to the first to third circuits is stopped.

One embodiment of the present invention is a semiconductor device that includes first to third circuits. The first circuit includes first and second nodes, first and second transistors, and first and second wirings. The second circuit includes first and second inverter circuits, third to eighth transistors, third and fourth nodes, and a third wiring. The third circuit includes first and second NAND circuits and third and fourth inverter circuits. The first node has a function of holding one of a first potential and a second potential. The second node has a function of holding the other of the first potential and the second potential. The first transistor has a function of controlling electrical continuity between the second node and the first wiring. The second transistor has a function of controlling electrical continuity between the first node and the second wiring. The first and second wirings are supplied with the first potential. The first node is electrically connected to the third node via the first inverter circuit and the third transistor. The first node is electrically connected to the third wiring via the fourth and fifth transistors. The second node is electrically connected to the fourth node via the second inverter circuit and the sixth transistor. The second node is electrically connected to the third wiring via the seventh and eighth transistors. A gate of the fourth transistor is electrically connected to the third node. A gate of the seventh transistor is electrically connected to the fourth node. A first signal is input to a gate of the fifth transistor and a gate of the eighth transistor. The third wiring is supplied with the second potential. The first signal is input to a first input terminal of the first NAND circuit. A second input terminal of the first NAND circuit is electrically connected to the fourth node. An output terminal of the first NAND circuit is electrically connected to a gate of the first transistor via the third inverter circuit. The first signal is input to a first input terminal of the second NAND circuit. A second input terminal of the second NAND circuit is electrically connected to the third node. An output terminal of the second NAND circuit is electrically connected to a gate of the second transistor via the fourth inverter circuit. The third and sixth transistors each preferably include an oxide semiconductor in a channel formation region.

In the above-described embodiment, the third node has a function of holding a potential supplied to the second node while the supply of a power supply potential to the first to third circuits is stopped. The fourth node has a function of holding a potential supplied to the first node while the supply of the power supply potential to the first to third circuits is stopped.

Another embodiment of the present invention is an electronic appliance that includes the semiconductor device of any of the above-described embodiments and a display device, a microphone, a speaker, an operation key, or a housing.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

Note that in this specification, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that one embodiment of the present invention is not limited to these expressions that are just examples. Here, X, Y, Z1, and Z2 each denote an object (e.g., a device, an element, a circuit, a wiring, an electrode, a terminal, a conductive film, a layer, or the like).

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

Note that the layout of circuit blocks in a block diagram in a drawing specifies the positional relation for description. Thus, even when a drawing shows that different functions are achieved in different circuit blocks, an actual circuit region may be configured so that the different functions are achieved in the same circuit block. The functions of circuit blocks in block diagrams are specified for description, and even in the case where one circuit block is illustrated, blocks might be provided in an actual circuit or an actual region so that processing performed by one circuit block is performed by a plurality of circuit blocks.

In this specification, the on state (simply referred to as ON) of an n-channel transistor means that the voltage difference between its gate and source (Vgs) is higher than the threshold voltage (Vth), and the on state of a p-channel transistor means that Vgs is lower than Vth. The off state (simply referred to as OFF) of an n-channel transistor means that Vgs is lower than Vth, and the off state of a p-channel transistor means that Vgs is higher than Vth. In addition, the off-state current in this specification refers to a drain current of a transistor in the off state. For example, the off-state current of an n-channel transistor sometimes refers to a drain current that flows when Vgs is lower than Vth. The off-state current of a transistor depends on Vgs in some cases. Thus, "the off-state current of a transistor is lower than or equal to $10^{-21}$ A" may mean "there is Vgs with which the off-state current of the transistor becomes lower than or equal to $10^{-21}$ A".

The off-state current of a transistor depends on voltage (Vds) between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds required for a semiconductor device or the like including the transistor or at Vds used in the semiconductor device or the like including the transistor.

One embodiment of the present invention can provide a semiconductor device with low power consumption. Another embodiment of the present invention can provide a method for driving a semiconductor device with low power consumption. Another embodiment of the present invention can provide a semiconductor device in which operation delay due to stop and restart of the supply of a power supply potential is suppressed. Another embodiment of the present invention can provide a method for driving a semiconductor device in which operation delay due to stop and restart of the supply of a power supply potential is suppressed. Another embodiment of the present invention can provide a novel semiconductor device and a method for driving the semiconductor device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 13A to 13D are cross-sectional views and circuit diagrams of semiconductor devices.

DETAILED DESCRIPTION OF THE INVENTION

Figure 1:
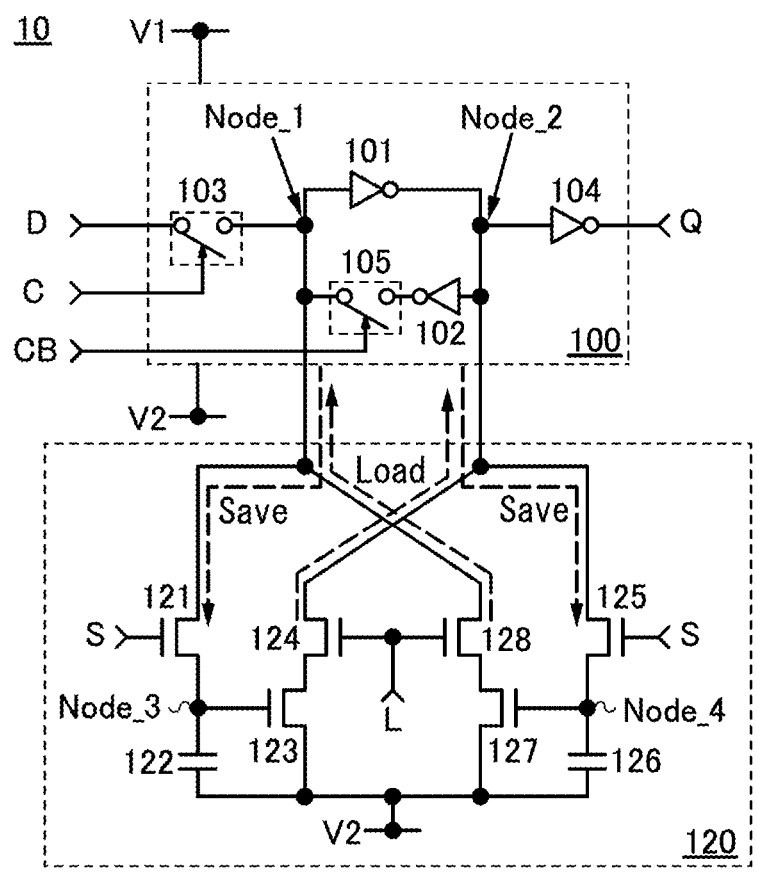
FIG. 1 is a circuit diagram illustrating an example of a semiconductor device.

Hereinafter, embodiments will be described with reference to the accompanying drawings. Note that the embodiments can be implemented with various modes. It will be readily appreciated by those skilled in the art that modes and details can be changed in various ways without departing from the spirit and scope of the present invention. Therefore, the present invention therefore should not be construed as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing. In addition, in the following embodiments and examples, the same portions or portions having similar functions are denoted by the same reference numerals in different drawings, and description thereof will not be repeated.

Embodiment 1

In this embodiment, a circuit configuration of a semiconductor device of one embodiment of the present invention and a method for driving the semiconductor device are described.
<<Circuit Configuration>>

Figure 2:
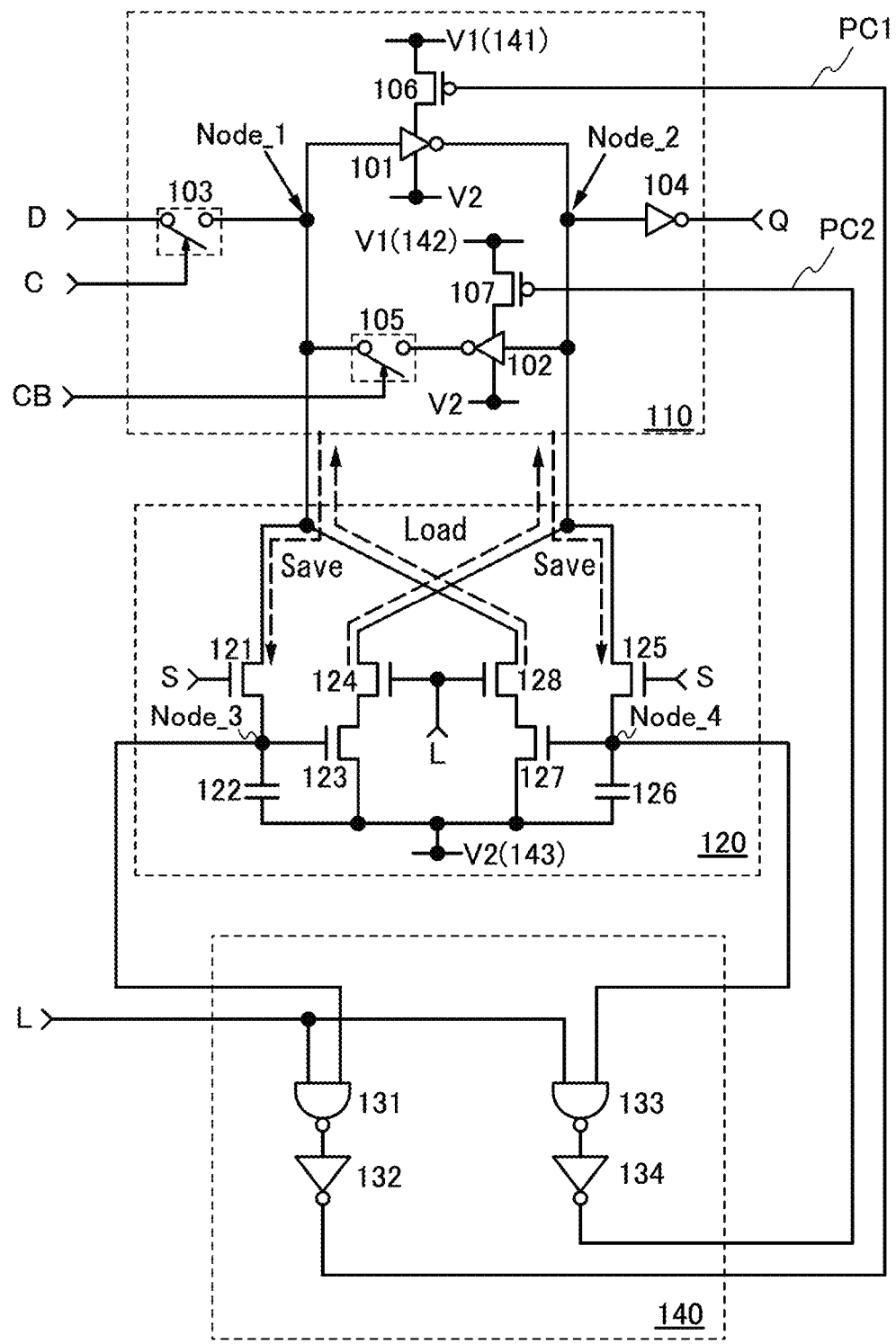
FIG. 2 is a circuit diagram illustrating an example of a semiconductor device.

FIG. 1 and FIG. 2 are each a circuit diagram of a semiconductor device of one embodiment of the present invention. A semiconductor device 10 in FIG. 1 can be roughly divided into a memory circuit 100 (also referred to as a first memory circuit) and a memory circuit 120 (also referred to as a second memory circuit). A semiconductor device 10a in FIG. 2 can be roughly divided into a memory circuit 110, the memory circuit 120, and a circuit 140.
<First Memory Circuit>

The memory circuit 100 in FIG. 1 can hold a potential corresponding to data while the supply of a power supply potential is continued.

The memory circuit 100 includes an inverter circuit 101, an inverter circuit 102, a switch 103, an inverter circuit 104, and a switch 105. The memory circuit 100 includes a node Node_1 and a node Node_2 capable of holding potentials corresponding to "1" and "0" as data while a power supply potential is supplied.

A data signal D, a clock signal C, and an inverted clock signal CB are input to the memory circuit 100, and a data signal Q is output from the memory circuit 100.

An input terminal of the inverter circuit 101 is connected to the node Node_1, and an output terminal of the inverter circuit 101 is connected to the node Node_2.

An input terminal of the inverter circuit 102 is connected to the node Node_2, and an output terminal of the inverter circuit 102 is connected to one terminal of the switch 105. The other terminal of the switch 105 is connected to the node Node_1. The on and off of the switch 105 are controlled by the inverted clock signal CB.

One terminal of the switch 103 is connected to a wiring to which the data signal D is supplied. The other terminal of the switch 103 is connected to the node Node_1. The on and off of the switch 103 are controlled by the clock signal C.

An input terminal of the inverter circuit 104 is connected to the node Node_2, and an output terminal of the inverter circuit 104 is connected to a wiring to which the data signal Q is supplied.

The inverter circuits 101, 102, and 104 are supplied with a potential V1 and a potential V2 (V1>V2) as power supply potentials. Each of the inverter circuits 101, 102, and 104 outputs the potential V2 to the output terminal when the potential V1 is supplied to the input terminal and outputs the potential V1 to the output terminal when the potential V2 is supplied to the input terminal.

As an example, the potential V1 is a high power supply potential VDD and the potential V2 is a low power supply potential VSS. The potential V2 may be a ground potential GND.

Note that here, 'data "1" is held in the node Node_1 or the node Node_2' means that the potential of the node Node_1 or the node Node_2 is the potential V1. In addition, 'data "0" is held in the node Node_1 or the node Node_2' means that the potential of the node Node_1 or the node Node_2 is the potential V2.

As described above, the potential V1 is higher than the potential V2. Thus, a potential that is held in or supplied to each node or each terminal on the basis of the potential V1 may be referred to as an "H-level" potential, and a potential that is held in or supplied to each node or each terminal on the basis of the potential V2 may be referred to as an "L-level" potential.

Potentials held in the nodes Node_1 and Node_2 are signals inverted from each other. In other words, the node Node_1 holds one of the H-level potential and the L-level potential, and the node Node_2 holds the other of the H-level potential and the L-level potential.

The switch 103 and the switch 105 may each be, for example, an analog switch. Alternatively, the switch 103 and the switch 105 each can be a transistor.

Although the inverter circuit 102 and the switch 105 are separately provided, one clocked inverter may be used instead of the inverter circuit 102 and the switch 105.

Note that the memory circuit 100 is not limited to the circuit in FIG. 1 and can be, for example, a volatile register, a flip-flop, or a latch circuit. The memory circuit 100 can be any of a D register, a T register, a JK register, and an RS register depending on the kind of data to be applied when a register is used as the memory circuit 100. In addition, when a flip-flop is used as the memory circuit 100, the memory circuit 100 can be any of a D flip-flop, a T flip-flop, a JK flip-flop, and an RS flip-flop depending on the kind of data to be applied.

While the supply of a power supply potential is stopped, potentials held in the nodes Node_1 and Node_2 are backed up in the memory circuit 120 (dotted arrows Save in FIG. 1). The potentials backed up in the memory circuit 120 are restored to the memory circuit 100 when the supply of the power supply potential is restarted. Note that the potentials held in the nodes Node_1 and Node_2 in the memory circuit 100 are lost when the supply of the power supply potential is stopped.

Note that "stop of the supply of a power supply potential" in this specification means that the potential difference (V1−V2) between the potential V1 and the potential V2 is switched to 0 by switching the potential of a wiring to which the potential V1 is supplied from the potential V1 to the potential V2. For example, "stop of the supply of a power supply potential to the semiconductor device 10" may mean that a switch provided between the memory circuit 100 and the wiring to which the potential V1 is supplied is turned off from an on state. For example, "stop of the supply of the power supply potential to the semiconductor device 10" may mean that a switch provided between the memory circuit 100 and the wiring to which the potential V2 is supplied is turned off from an on state.

Note that "restart of the supply of a power supply potential" in this specification means that the potential difference (V1−V2) between the potential V1 and the potential V2 is switched from 0 to a value exceeding 0 by switching the potential of the wiring to which the potential V1 is supplied from the potential V2 to the potential V1. For example, "restart of the supply of a power supply potential to the semiconductor device 10" may mean that a switch provided between the memory circuit 100 and the wiring to which the potential V1 is supplied is turned on from an off state. For example, "restart of the supply of the power supply potential to the semiconductor device 10" may mean that a switch provided between the memory circuit 100 and the wiring to which the potential V2 is supplied is turned off from an on state.

Note that "continuation of the supply of a power supply potential" in this specification means that the potential V1, with which the potential difference (V1−V2) between the potential V1 and the potential V2 becomes a value exceeding 0, is continuously supplied by holding the potential of the wiring to which the potential V1 is supplied at the potential V1. For example, "continuation of the supply of a power supply potential to the semiconductor device 10" may mean that a switch provided between the memory circuit 100 and the wiring to which the potential V1 is supplied is kept on. For example, "continuation of the supply of the power supply potential to the semiconductor device 10" may mean that a switch provided between the memory circuit 100 and the wiring to which the potential V2 is supplied is kept on.

<Second Memory Circuit>

The memory circuit 120 in FIG. 1 can hold a potential corresponding to data while the supply of a power supply potential is stopped.

The memory circuit 120 includes a transistor 121, a capacitor 122, a transistor 123, a transistor 124, a transistor 125, a capacitor 126, a transistor 127, and a transistor 128. In addition, the memory circuit 120 includes a node Node_3 and a node Node_4 that can hold potentials corresponding to "1" and "0" as data at least while the supply of the power supply potential is stopped.

The node Node_3 holds the potential of the node Node_1 at least while the supply of the power supply potential is stopped. The node Node_4 holds the potential of the node Node_2 at least while the supply of the power supply potential is stopped.

A gate of the transistor 121 is connected to a wiring to which a control signal Save (denoted by S in the drawing) is supplied. One of a source and a drain of the transistor 121 is connected to the node Node_1. The other of the source and the drain of the transistor 121 is connected to the node Node_3. Note that as an example, the transistor 121 is an n-channel transistor in the following description.

One electrode of the capacitor 122 is connected to the node Node_3. The other electrode of the capacitor 122 is connected to a wiring to which the potential V2 is supplied. Note that the capacitor 122 can be eliminated when the transistor 123 has large gate capacitance, for example.

A gate of the transistor 123 is connected to the node Node_3. One of a source and a drain of the transistor 123 is connected to the wiring to which the potential V2 is supplied. Note that as an example, the transistor 123 is an n-channel transistor in the following description.

A gate of the transistor 124 is connected to a wiring to which a control signal Load (denoted by L in the drawing) is supplied. One of a source and a drain of the transistor 124 is connected to the other of the source and the drain of the transistor 123. The other of the source and the drain of the transistor 124 is connected to the node Node_2. Note that as an example, the transistor 124 is an n-channel transistor in the following description.

A gate of the transistor 125 is connected to a wiring to which the control signal Save is supplied. One of a source and a drain of the transistor 125 is connected to the node Node_2. The other of the source and the drain of the transistor 125 is connected to the node Node_4. Note that as an example, the transistor 125 is an n-channel transistor in the following description.

One electrode of the capacitor 126 is connected to the node Node_4. The other electrode of the capacitor 126 is connected to the wiring to which the potential V2 is supplied. Note that the capacitor 126 can be eliminated when the transistor 127 has large gate capacitance, for example.

A gate of the transistor 127 is connected to the node Node_4. One of a source and a drain of the transistor 127 is connected to the wiring to which the potential V2 is supplied. Note that as an example, the transistor 127 is an n-channel transistor in the following description.

A gate of the transistor 128 is connected to the wiring to which the control signal Load is supplied. One of a source and a drain of the transistor 128 is connected to the other of the source and the drain of the transistor 127. The other of the source and the drain of the transistor 128 is connected to the node Node_1. Note that as an example, the transistor 128 is an n-channel transistor in the following description.

The control signal Save is a signal for switching between electrical continuity and discontinuity between the node Node_1 and the node Node_3. In addition, the control signal Save is a signal for switching between electrical continuity and discontinuity between the node Node_2 and the node Node_4. In the circuit configuration in FIG. 1, electrical continuity is established between the node Node_1 and the node Node_3 and between the node Node_2 and the node Node_4 when the potential of the control signal Save is H level, whereas electrical continuity is not established when the potential of the control signal Save is L level.

When the control signal Save is switched to H level, data of the nodes Node_1 and Node_2 in the memory circuit 100 can be stored in the nodes Node_3 and Node_4. In addition, when the control signal Save is switched to L level, the nodes Node_3 and Node_4 are in an electrically floating state, so that the nodes Node_3 and Node_4 can hold data as potentials.

The control signal Load is a signal for switching between electrical continuity and discontinuity between the node Node_2 and the other of the source and the drain of the transistor 123. The control signal Load is also a signal for switching between electrical continuity and discontinuity between the node Node_1 and the other of the source and the drain of the transistor 127. In the circuit configuration in FIG. 1, electrical continuity is established between the node Node_2 and the other of the source and the drain of the transistor 123 and between the node Node_1 and the other of the source and the drain of the transistor 127 when the potential of the control signal Load is H level, whereas electrical continuity is not established when the potential of the control signal Load is L level.

Data held as potentials in the nodes Node_3 and Node_4 in the memory circuit 120 while the supply of the power supply potential is stopped can be restored to the nodes Node_1 and Node_2 in the memory circuit 100 by controlling the control signal Load when the supply of the power supply potential is restarted (dotted arrows Load in the drawing).

As a specific example, the case where before the supply of the power supply potential is stopped, data "1" corresponding to the potential V1 held in the node Node_1 is stored in the node Node_3 and data "0" corresponding to the potential V2 held in the node Node_2 is stored in the node Node_4 is described. Even when the supply of the power supply potential is stopped, the potential of the node Node_3 is kept at the potential V1 and the potential of the node Node_4 is kept at the potential V2; however, the potentials of the nodes Node_1 and Node_2 have undefined values.

Since the potential V1 of the gate of the transistor 123 is higher than the potential V2, the transistor 123 has lower channel resistance than the transistor 127. Thus, in the case where the transistor 124 and the transistor 128 are turned on by setting the control signal Load at the H level, the potential of the other of the source and the drain of the transistor 124 connected to the node Node_2 is lower than the potential of the other of the source and the drain of the transistor 128 connected to the node Node_1. The transistor 124 and the transistor 128 are turned on; thus, in the memory circuit 100, the potential difference between the node Node_1 and the node Node_2 is generated.

The potential difference allows the node Node_2 to have the potential V2 and the node Node_1 to hold the potential V1 when the supply of the power supply potential is restarted in the memory circuit 100. Data corresponding to these potentials of the nodes Node_1 and Node_2 correspond to data of the nodes Node_1 and Node_2 in the memory circuit 100 when being held in the nodes Node_3 and Node_4 in the memory circuit 120, that is, just before the supply of the power supply potential is stopped.

A semiconductor material whose band gap is wider than that of silicon and whose intrinsic carrier density is lower than that of silicon is preferably used for channel formation regions of the transistors 121 and 125. For example, an oxide semiconductor is preferable as the semiconductor material. An oxide semiconductor transistor in which an oxide semiconductor is used for a channel formation region has significantly low off-state current. Electric charge is supplied to the nodes Node_3 and Node_4 only through the sources and the drains of the transistors 121 and 125. By using oxide semiconductor transistors as the transistors 121 and 125, the potentials of the nodes Node_3 and Node_4 can be kept substantially constant while these transistors are off. For this reason, data can be held in the nodes Node_3 and Node_4 regardless of whether the power supply potential is supplied. In other words, data held in the nodes Node_1 and Node_2 in the memory circuit 100 can be backed up in the nodes Node_3 and Node_4. Note that the significantly low off-state current means that normalized off-state current per micrometer of channel width at room temperature is lower than or equal to $10 \times 10^{-21}$ A.

The transistors 123, 124, 127, and 128 can be formed using any of a variety of semiconductor materials. For example, a material such as silicon or germanium can be used. Alternatively, it is possible to use a compound semiconductor or an oxide semiconductor. Note that as the transistors 123, 124, 127, and 128, a transistor whose mobility is high (e.g., a transistor in which a channel is formed in single crystal silicon) is preferably used.

Figure 24:
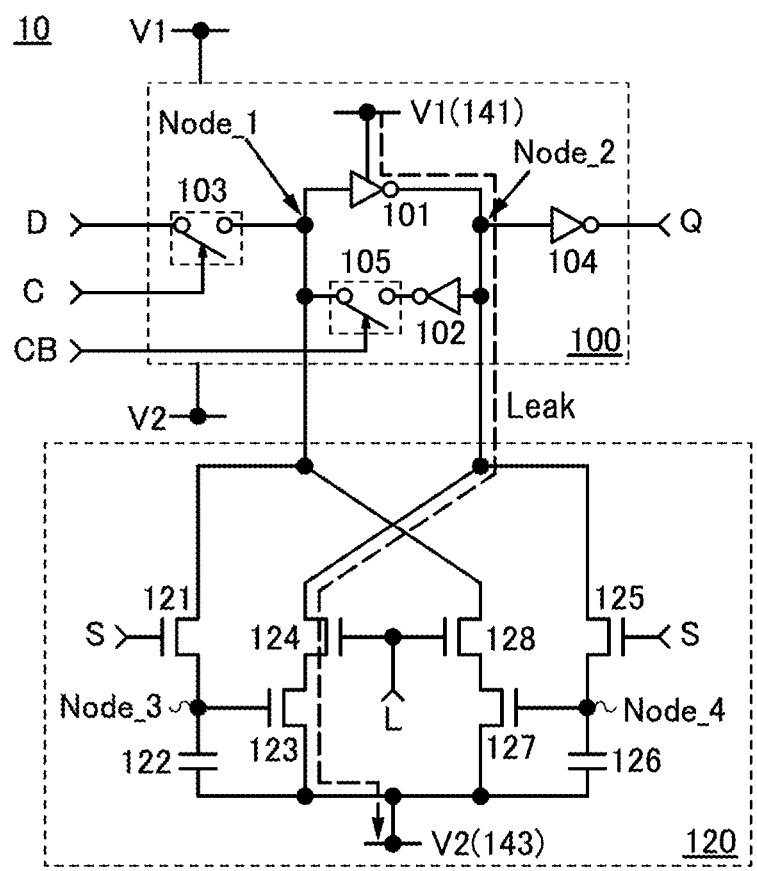
FIG. 24 is a circuit diagram for illustrating shoot-through current flowing in a semiconductor device.

In the configuration in FIG. 1, when the transistor 124 is turned on to restore data with the potential of the node Node_2 set at H level (with electrical continuity established between the node Node_2 and a wiring for supplying a high power supply potential (potential V1) to the inverter circuit 101) after the H-level potential of the node Node_1 is stored in the node Node_3, electrical continuity is temporarily established between the wiring for supplying the high power supply potential (referred to as a wiring 141) and a wiring for supplying a low power supply potential (potential V2) to the transistor 123 (referred to as a wiring 143), so that shoot-through current flows and power consumption is increased. A path of the shoot-through current is shown (by dashed arrow Leak) in FIG. 24.

<Circuit for Controlling Shoot-Through Current>

In order to solve the above problem, when data are restored to the node Node_1 and the node Node_2, the electrical continuity between the node Node_1 and the wiring for supplying the high power supply potential or the electrical continuity between the node Node_2 and the wiring for supplying the high power supply potential is preferably broken so that the shoot-through current does not flow. When data restoration is completed, the electrical continuity may be established again. The semiconductor device 10a for achieving such control of the electrical continuity is described with reference to FIG. 2.

The semiconductor device 10a in FIG. 2 includes the memory circuit 110, the memory circuit 120, the circuit 140, a node PC1, and a node PC2. The memory circuit 120 is the same as the memory circuit 120 in FIG. 1 and thus is not described here.

The memory circuit 110 in FIG. 2 differs from the memory circuit 100 in FIG. 1 in including a transistor 106 and a transistor 107.

A gate of the transistor 106 is electrically connected to the node PC1. One of a source and a drain of the transistor 106 is electrically connected to a high power supply potential input terminal of the inverter circuit 101, and the other of the source and the drain of the transistor 106 is electrically connected to the wiring to which the potential V1 is supplied (the wiring 141). Note that as an example, the transistor 106 is a p-channel transistor in the following description.

A gate of the transistor 107 is electrically connected to the node PC2. One of a source and a drain of the transistor 107 is electrically connected to a high power supply potential input terminal of the inverter circuit 102, and the other of the source and the drain of the transistor 107 is electrically connected to a wiring to which the potential V1 is supplied (referred to as a wiring 142). Note that as an example, the transistor 107 is a p-channel transistor in the following description.

Components other than the transistors 106 and 107 in the memory circuit 110 are the same as those in the memory circuit 100 in FIG. 1 and thus are not described here.

The circuit 140 in FIG. 2 includes a NAND circuit 131, an inverter circuit 132, a NAND circuit 133, and an inverter circuit 134.

A first input terminal of the NAND circuit 131 is electrically connected to a wiring to which the control signal Load is input, and a second input terminal of the NAND circuit 131 is electrically connected to the node Node_3. An output terminal of the NAND circuit 131 is electrically connected to an input terminal of the inverter circuit 132.

An output terminal of the inverter circuit 132 is electrically connected to the node PC1.

A first input terminal of the NAND circuit 133 is electrically connected to the wiring to which the control signal Load is input, and a second input terminal of the NAND circuit 133 is electrically connected to the node Node_4. An output terminal of the NAND circuit 133 is electrically connected to an input terminal of the inverter circuit 134.

An output terminal of the inverter circuit 134 is electrically connected to the node PC2.

The circuit 140 in FIG. 2 can turn off the transistor 106 or 107 to electrically disconnect the wiring 141 and the inverter circuit 101 from each other or electrically disconnect the wiring 142 and the inverter circuit 102 from each other when an H-level potential is supplied as the control signal Load to restore the data of the nodes Node_1 and Node_2. Such electrical disconnection can prevent temporary electrical continuity between the wiring 141 or 142 and the wiring 143, can prevent shoot-through current, and can reduce power consumption.

The transistors 106 and 107, the NAND circuit 131, the inverter circuit 132, the NAND circuit 133, and the inverter circuit 134 can be formed using any of a variety of semiconductor materials. For example, a material such as silicon or germanium can be used. Alternatively, it is possible to use a compound semiconductor or an oxide semiconductor. Note that as the transistors 106 and 107, the NAND circuit 131, the inverter circuit 132, the NAND circuit 133, and the inverter circuit 134, a transistor whose mobility is high (e.g., a transistor in which a channel is formed in single crystal silicon) is preferably used.

<<Timing Chart>>

Circuit operation of the semiconductor device 10a in FIG. 2 is described with reference to a timing chart in FIG. 3.

Figure 3:
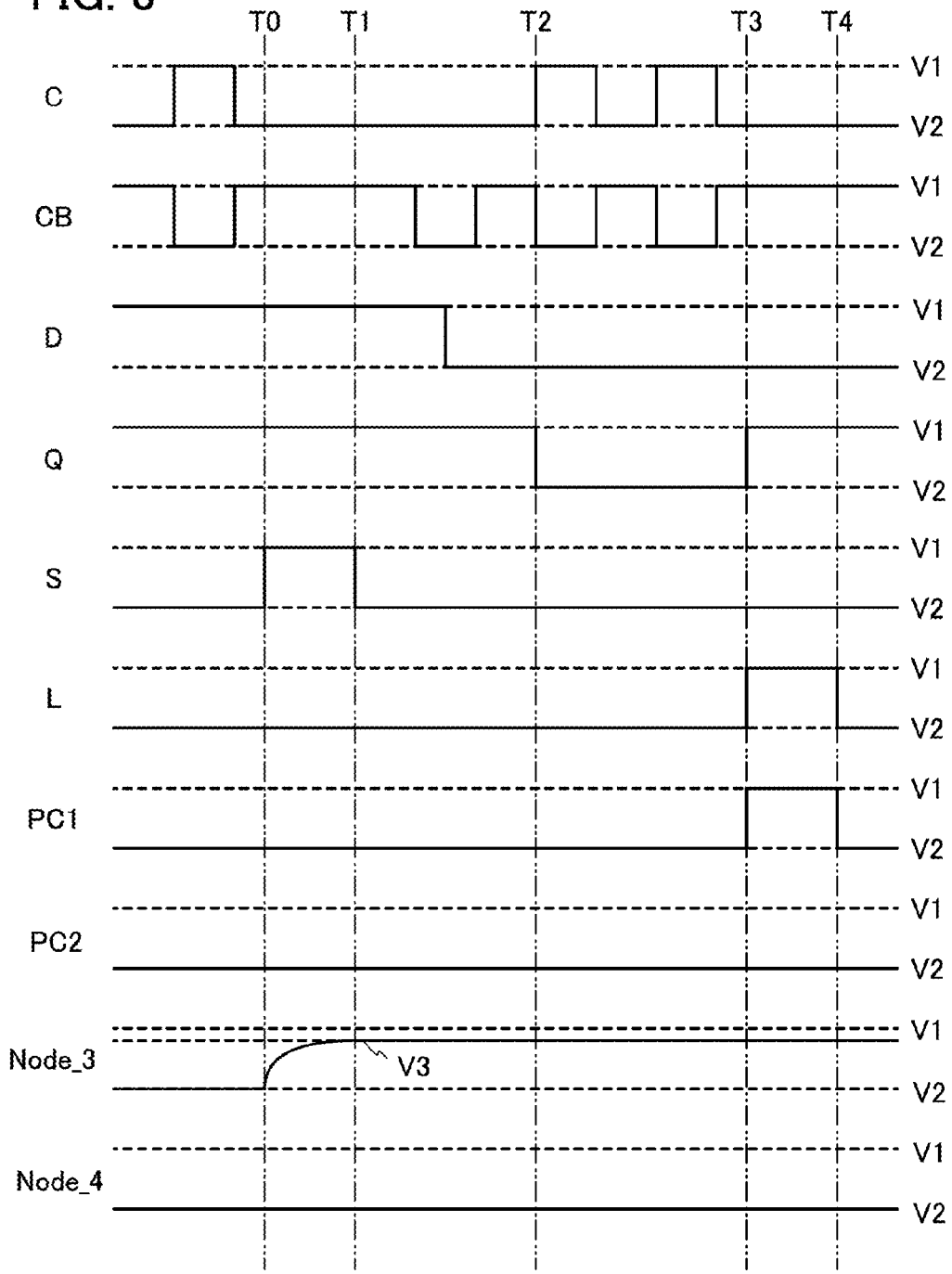
FIG. 3 is a timing chart illustrating an operation example of a semiconductor device.

In the timing chart in FIG. 3, C represents the potential of a wiring to which the clock signal C is supplied; CB, the potential of a wiring to which the inverted clock signal CB is supplied; D, the potential of the wiring to which the data signal D is supplied; Q, the potential of the wiring to which the data signal Q is supplied; S, the potential of the wiring to which the control signal Save is supplied; L, the potential of the wiring to which the control signal Load is supplied; PC1, the potential of the node PC1; PC2, the potential of the node PC2; Node_3, the potential of the node Node_3; and Node_4, the potential of the node Node_4.

In the timing chart in FIG. 3, times T0 to T4 are added in order to describe the timings of operation.

When the potential of the control signal Save is set at H level at Time T0, data back-up from the memory circuit 110 to the memory circuit 120 is started. The node Node_3 is supplied with the same H-level potential as the node Node_1, and the node Node_4 is supplied with the same L-level potential as the node Node_2.

When the potential of the control signal Save is set at L level at Time T1, the data back-up from the memory circuit 110 to the memory circuit 120 is terminated. Since the nodes Node_3 and Node_4 are in an electrically floating state, the node Node_3 maintains the H-level potential and the node Node_4 maintains the L-level potential. Note that as the H-level potential of the node Node_3 at this time, a potential V3 that is lower than the potential V1 by the threshold voltage of the transistor 121 is maintained.

When the potential of the clock signal C is set at H level at Time T2, the potential of the data signal D (L-level potential) is supplied to the memory circuit 110, so that the potential of the data signal Q is set at L level.

In the period from Time T2 to Time T3, the supply of a power supply potential to the semiconductor device 10a may be stopped. If the supply of the power supply potential is stopped, data held in the memory circuit 110 is erased; however, the data backed up in the memory circuit 120 remains without being erased.

When the potential of the control signal Load is set at H level at Time T3 after the supply of the power supply potential to the semiconductor device 10a is restarted, data restoration from the memory circuit 120 to the memory circuit 110 is started. Since the potential of the node Node_4 is at L level, the electrical discontinuity between the node Node_1 and the wiring 143 is maintained and the potential of the node Node_1 is not changed. In contrast, since the potential of the node Node_3 is at H level, the electrical continuity between the node Node_2 and the wiring 143 is established and the potential of the node Node_2 is changed to L level. At this time, since the potential of the node PC1 is at H level, the transistor 106 is turned off and the output of the inverter circuit 101 becomes high impedance. Thus, the wirings 141 and 143 are disconnected from each other, so that the generation of shoot-through current can be prevented. In addition, since the potential of the node PC2 is at L level, the transistor 107 is turned on and a high power supply potential is supplied to the inverter circuit 102. When the potential of the node Node_2 is set at L level, the potential of the node Node_1 is changed to H level by the inverter circuit 102. The data signal Q is returned to the H-level potential that is the potential before Time T1 at which the data back-up has been terminated.

When the potential of the control signal Load is set at L level at Time T4, the data restoration from the memory circuit 120 to the memory circuit 110 is terminated. At the same time, the potential of the node PC1 is changed to L level, so that the transistor 106 is turned on and a high power supply potential is supplied to the inverter circuit 101. Thus, the memory circuit 110 can hold the restored data.

By the above-described circuit operation, the data back-up from the memory circuit 110 to the memory circuit 120 and the data restoration from the memory circuit 120 to the memory circuit 110 can be achieved.

This embodiment can be combined as appropriate with any of the other embodiments and an example in this specification.

Embodiment 2

In this embodiment, modification examples of a semiconductor device of one embodiment of the present invention are described.

Modification Example 1

Figure 4:
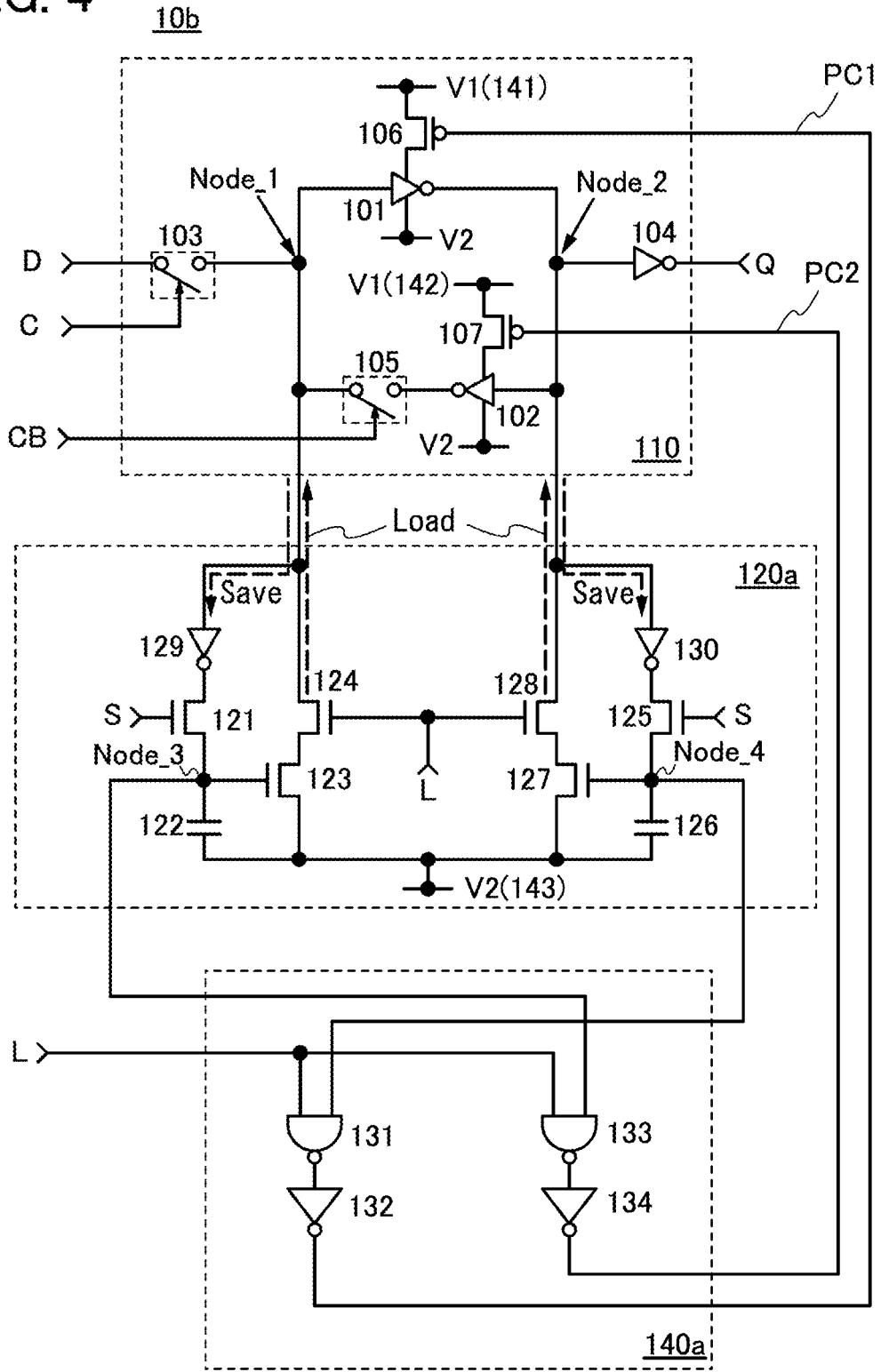
FIG. 4 is a circuit diagram illustrating an example of a semiconductor device.

A semiconductor device 10b in FIG. 4 can be roughly divided into the memory circuit 110, a memory circuit 120a, and a circuit 140a. Note that the memory circuit 110 in FIG. 4 is the same as the memory circuit 110 in FIG. 2 and thus is not described here.

The memory circuit 120a in FIG. 4 can hold a potential corresponding to data while the supply of a power supply potential is stopped.

The semiconductor device 10b in FIG. 4 differs from the semiconductor device 10a in FIG. 2 in that an inverter circuit 129 is provided between the node Node_1 and the transistor 121; an inverter circuit 130 is provided between the node Node_2 and the transistor 125; the other of the source and the drain of the transistor 124 is connected to the node Node_1; the other of the source and the drain of the transistor 128 is connected to the node Node_2; the second input terminal of the NAND circuit 131 is connected to the node Node_4; and the second input terminal of the NAND circuit 133 is connected to the node Node_3. That is, in FIG. 4, the inverter circuits 129 and 130 are added, so that the connection relation between the wiring 143 and the nodes Node_1 and Node_2 and the connection relations between the NAND circuits 131 and 133 and the nodes Node_3 and Node_4 are changed.

When data "1" is supplied to the node Node_1 and data "0" is supplied to the node Node_2 in the semiconductor device 10b, data "0" is stored in the node Node_3 and data "1" is stored in the node Node_4 before the supply of the power supply potential is stopped. When the supply of the power supply potential is started, the potential V2 is supplied to the node Node_2 via the transistors 127 and 128. As a result, data "1" is supplied to the node Node_1 and data "0" is supplied to the node Node_2. In other words, the memory circuit 110 returns to the same state as that before the supply of the power supply potential is stopped.

The description of the semiconductor device 10a can be referred to for the details of the other components in the semiconductor device 10b.

A malfunction is less likely to occur in the semiconductor device 10b than in the semiconductor device 10a. Specifically, a malfunction might occur as follows: when the transistors 121 and 125 are turned on by setting the potential of the control signal Save at H level, charge moves from the nodes Node_3 and Node_4 to the nodes Node_1 and Node_2, so that data of the nodes Node_1 and Node_2 are rewritten in the semiconductor device 10a. In particular, the above-described malfunction is likely to occur when the capacitance of the capacitors 122 and 126 is increased to improve data retention characteristics.

In contrast, since the semiconductor device 10b does not have paths through which charge moves directly from the nodes Node_3 and Node_4 to the nodes Node_1 and Node_2, rewriting of data of the nodes Node_1 and Node_2 is less likely to occur. Thus, the above-described malfunction is less likely to occur even when the capacitance of the capacitors 122 and 126 is increased.

A malfunction is less likely to occur in the semiconductor device 10b; thus, the semiconductor device can have high reliability.

Modification Example 2

Figure 18:
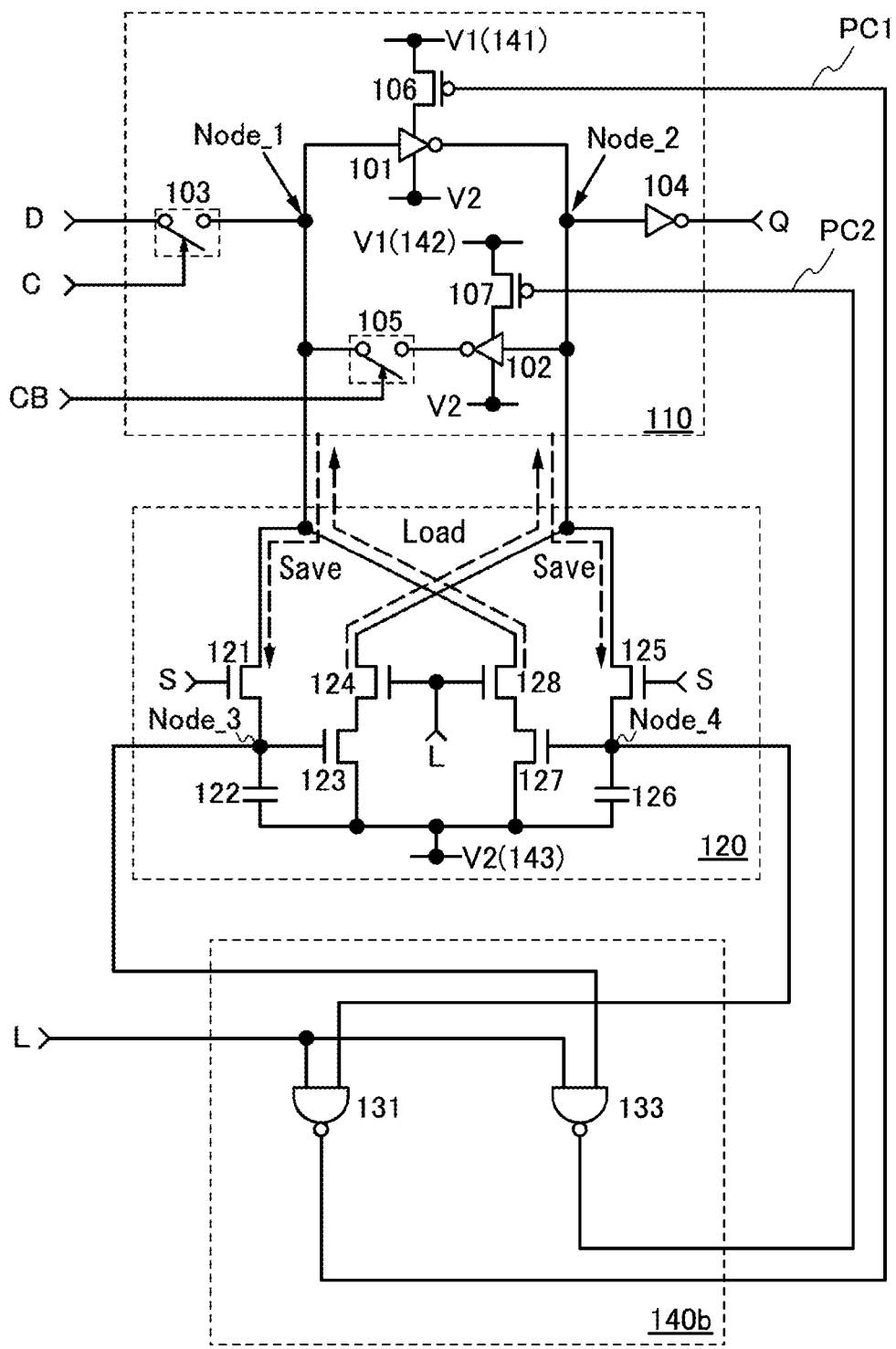
FIG. 18 is a circuit diagram illustrating an example of a semiconductor device.

A semiconductor device 10c in FIG. 18 can be roughly divided into the memory circuit 110, the memory circuit 120, and a circuit 140b. The memory circuits 110 and 120 in FIG.

18 are the same as the memory circuits 110 and 120 in FIG. 2 and thus are not described here.

The semiconductor device 10c in FIG. 18 differs from the semiconductor device 10a in FIG. 2 in that the inverter circuits 132 and 134 in FIG. 2 are not provided; the second input terminal of the NAND circuit 131 is connected to the node Node_4; and the second input terminal of the NAND circuit 133 is connected to the node Node_3. That is, in FIG. 18, the inverter circuits 132 and 134 are not provided, so that the connection relations between the NAND circuits 131 and 133 and the nodes Node_3 and Node_4 are changed.

The semiconductor device 10c can produce an effect similar to that of the semiconductor device 10a and can have a simpler circuit configuration.

Modification Example 3

Figure 19:
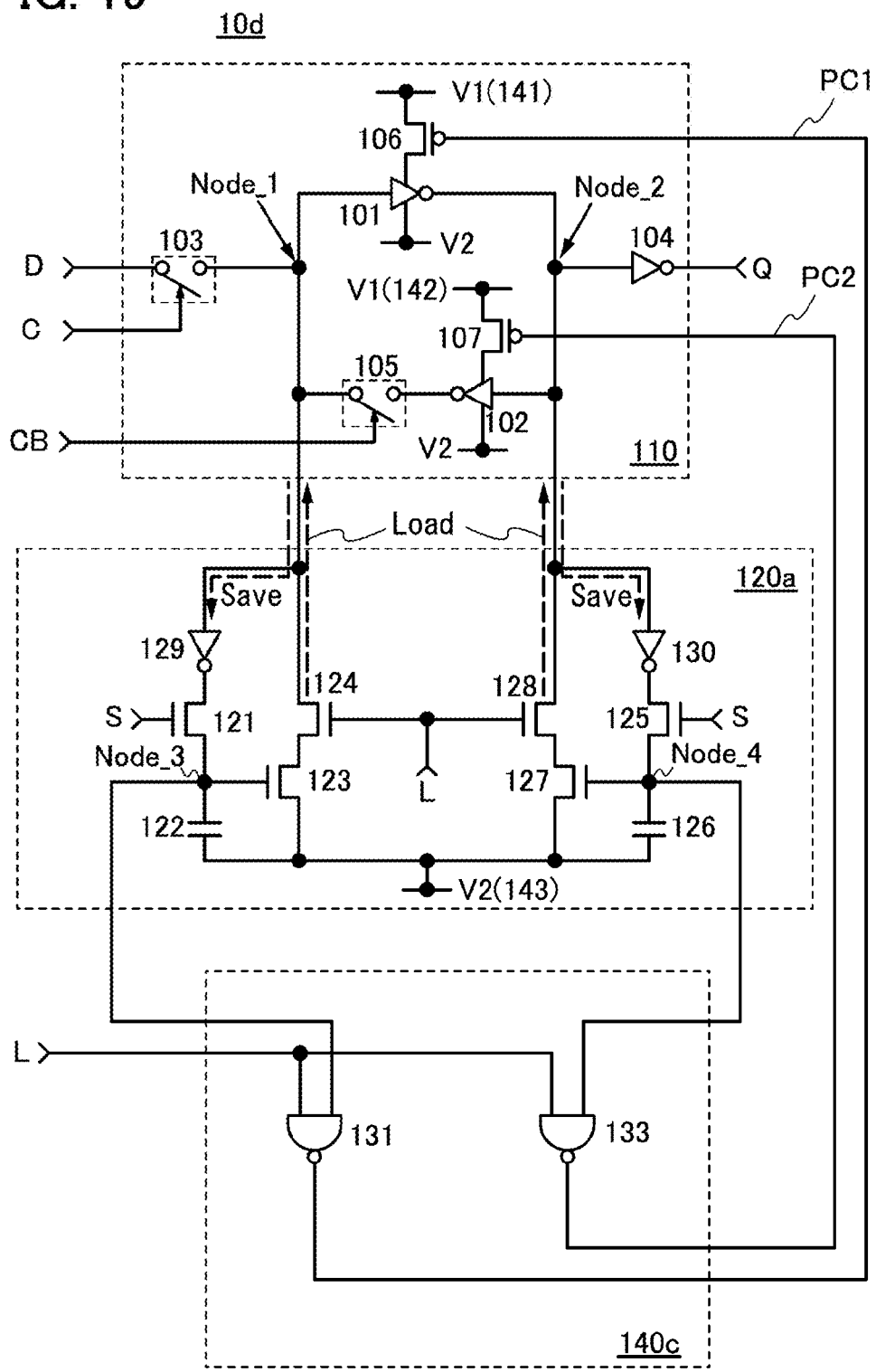
FIG. 19 is a circuit diagram illustrating an example of a semiconductor device.

A semiconductor device 10d in FIG. 19 can be roughly divided into the memory circuit 110, the memory circuit 120a, and a circuit 140c. The memory circuits 110 and 120a in FIG. 19 are the same as the memory circuits 110 and 120a in FIG. 4, and thus are not described here.

The semiconductor device 10d in FIG. 19 differs from the semiconductor device 10b in FIG. 4 in that the inverter circuits 132 and 134 in FIG. 4 are not provided; the second input terminal of the NAND circuit 131 is connected to the node Node_3; and the second input terminal of the NAND circuit 133 is connected to the node Node_4. That is, in FIG. 19, the inverter circuits 132 and 134 are not provided, so that the connection relations between the NAND circuits 131 and 133 and the nodes Node_3 and Node_4 are changed.

The semiconductor device 10d can produce an effect similar to that of the semiconductor device 10b and can have a simpler circuit configuration.

This embodiment can be combined as appropriate with any of the other embodiments and an example in this specification.

Embodiment 3

In this embodiment, a PLD of one embodiment of the present invention is described.

Figure 5:
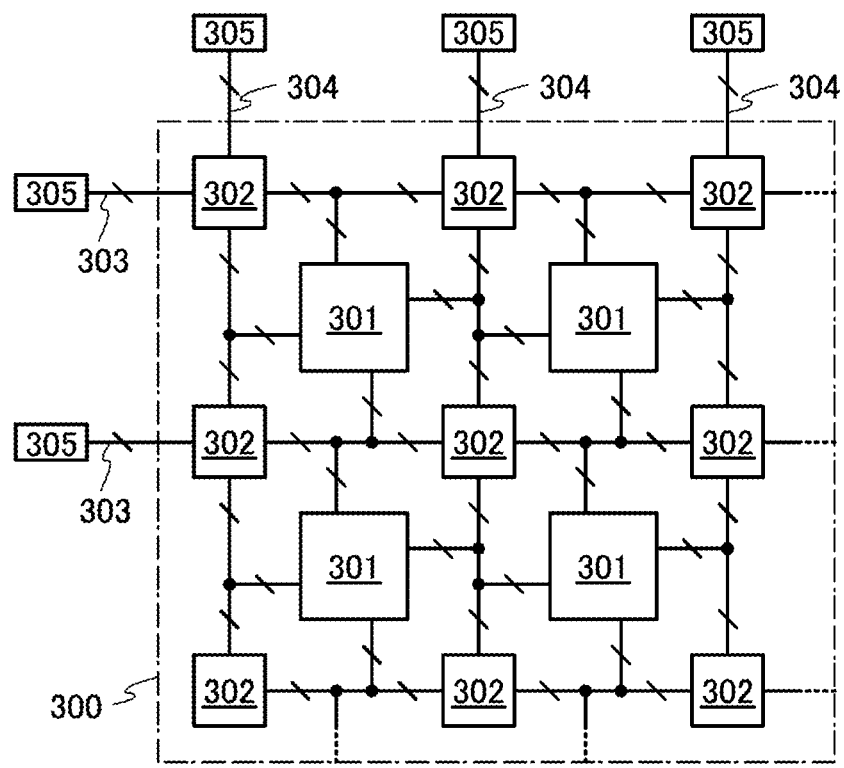
FIG. 5 is a block diagram illustrating a specific example of a semiconductor device.

FIG. 5 is an example of a block diagram of a logic array included in a PLD. A logic array 300 includes a plurality of logic elements (hereinafter referred to as LEs) 301 arranged in an array. Here, the expression "arranged in an array" means that the LEs are arranged in a matrix at regular intervals, and the arrangement is not limited to that illustrated in FIG. 5.

A plurality of wirings are formed to surround the LEs 301. In FIG. 5, these wirings consist of a plurality of horizontal wiring groups 303 and a plurality of vertical wiring groups 304. A wiring group is a bundle of a plurality of wirings. A switch portion 302 is provided at an intersection of the horizontal wiring group 303 and the vertical wiring group 304. The horizontal wiring groups 303 and the vertical wiring groups 304 are connected to input-output terminals 305 to transmit and receive signals to and from a circuit provided outside the logic array 300.

Input-output terminals of the plurality of LEs 301 are connected to the horizontal wiring groups 303 and the vertical wiring groups 304 provided around the LEs 301. For example, in FIG. 5, the input-output terminals of the LEs 301 are connected to the horizontal wiring groups 303 and the vertical wiring groups 304 on the left, right, top, and bottom sides. With the use of these input-output terminals, each of the LEs 301 can be connected to another LE 301. A connection path between one LE 301 and another LE 301 is determined by a switch for switching connection between wirings provided in the switch portion 302.

On/off of the switch for switching connection between wirings in the switch portion 302 is determined in accordance with configuration data. In the case of a rewritable structure, the configuration memory provided in the switch portion 302 preferably includes a nonvolatile memory element to prevent loss of stored configuration data due to stop of the supply of a power supply potential.

Figure 6:
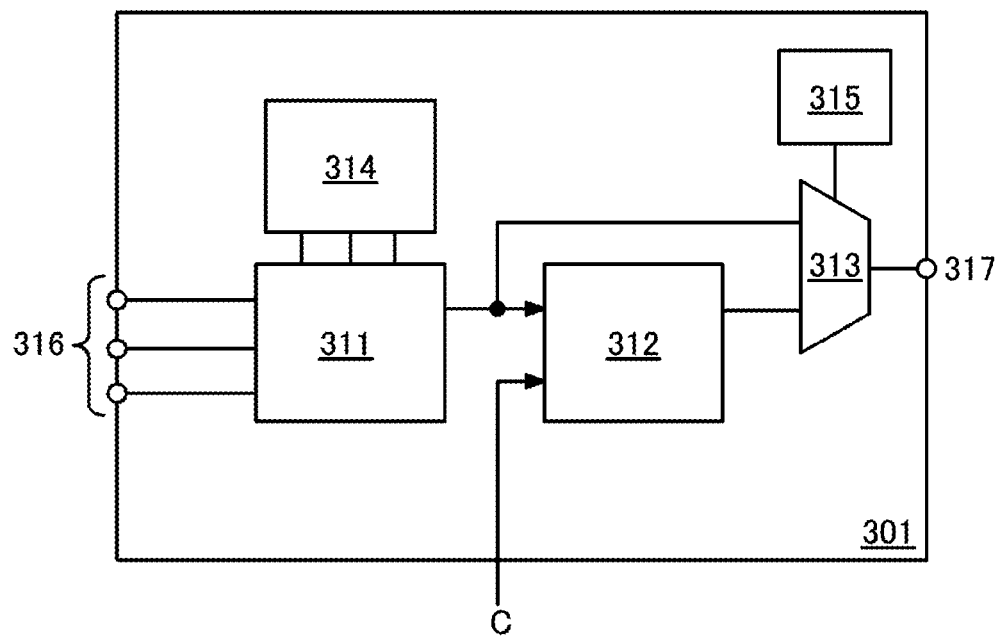
FIG. 6 is a block diagram illustrating a specific example of a semiconductor device.

FIG. 6 is a block diagram of the LE 301 in FIG. 5. The LE 301 in FIG. 6 includes, for example, a lookup table (hereinafter referred to as an LUT) 311, a flip-flop 312, and a multiplexer 313. Furthermore, in FIG. 6, configuration memories 314 and 315 electrically connected to the LUT 311 and the multiplexer 313, respectively, are provided.

In the case of a rewritable structure, the configuration memories 314 and 315 each preferably include a nonvolatile memory element to prevent loss of stored configuration data due to stop of the supply of the power supply potential.

The configuration data refers to, for example, data of the LUT 311, information on selection of input signals of the multiplexer 313, and data on whether the switch portion 302 is conductive or not. The configuration memory refers to a memory circuit for storing the configuration data.

A logic circuit determined by the LUT 311 varies depending on the content of configuration data stored in the configuration memory 314. When the configuration data is determined, one output value of the LUT 311 with respect to input values of a plurality of input signals input to input terminals 316 is determined. Then, the LUT 311 outputs a signal containing the output value.

The flip-flop 312 holds the signal output from the LUT 311 and outputs an output signal corresponding to the signal to the multiplexer 313 in synchronization with a clock signal C.

The output signal from the LUT 311 and the output signal from the flip-flop 312 are input to the multiplexer 313. The multiplexer 313 has a function of selecting and outputting one of the two output signals in accordance with configuration data stored in the configuration memory 315. The output signal from the multiplexer 313 is output from an output terminal 317.

In one embodiment of the present invention, when the semiconductor device described in the above embodiment is used for a circuit for temporarily storing data therein, e.g., the flip-flop 312, loss of data in the flip-flop caused by stop of the supply of a power supply potential can be prevented. Furthermore, data held before the stop of the supply of the power supply potential can be backed up in a short time, and the data can be restored in a short time after the supply of the power supply potential is restarted. Accordingly, the supply of the power supply potential can be stopped in a plurality of logic elements included in the PLD. Thus, power consumption of the PLD can be low.

Figure 7A:
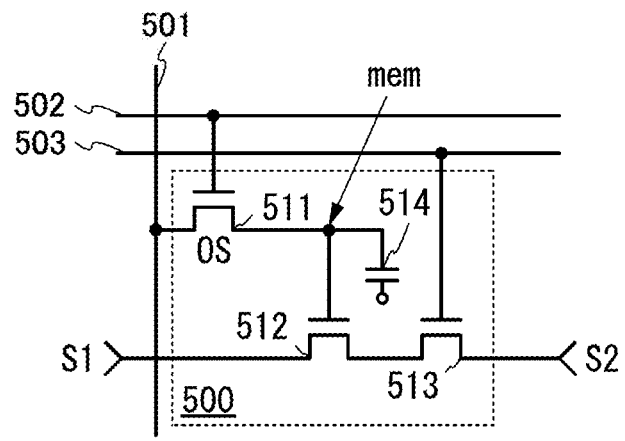
FIGS. 7A and 7B are circuit diagrams each illustrating a specific example of a semiconductor device.

FIG. 7A illustrates an example of a nonvolatile memory element that can be used as a configuration memory provided in the switch portion 302. The nonvolatile memory element in FIG. 7A has a structure in which a configuration memory is formed using a transistor including an oxide semiconductor. When the nonvolatile memory element used as the configuration memory is configured to hold data by utilizing a low off-state current of the transistor including an oxide semiconductor, the configuration memory can be manufactured through a manufacturing process of the transistor and by stacking the transistors, for example. This is highly advantageous in reducing cost.

Note that in a memory circuit that utilizes an extremely low off-state current of a transistor including an oxide semiconductor layer in a channel portion, a predetermined voltage might keep being supplied to the transistor in a period for retaining data. For example, a voltage that turns off the transistor completely might keep being supplied to a gate of the transistor. Alternatively, a voltage that shifts the threshold voltage of the transistor to make the transistor in a normally-off state may keep being supplied to a back gate of the transistor. In these cases, the voltage is supplied to the memory circuit in the period for holding data. However, because almost no current flows, little power is consumed. Because of little power consumption, even if the predetermined voltage is supplied to the memory circuit, the memory circuit can be regarded as being substantially nonvolatile.

FIG. 7A illustrates a configuration memory 500 provided in the switch portion 302, for example. The configuration memory 500 controls electrical connection between a terminal S1 and a terminal S2 in accordance with configuration data held in a node mem.

The configuration memory 500 in FIG. 7A includes a transistor 511, a transistor 512, a transistor 513, and a capacitor 514.

Figure 7B:
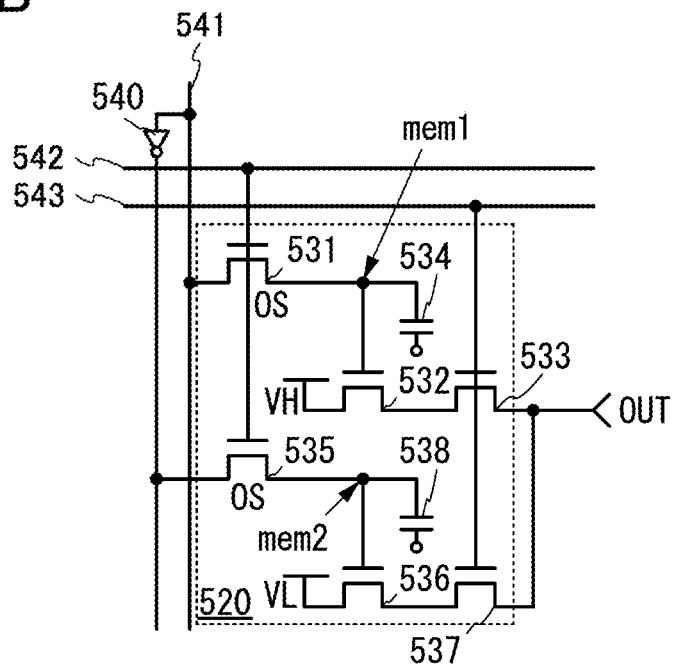

FIG. 7B illustrates, for example, a configuration memory 520 that can control the LUT 311 and the multiplexer 313. The configuration memory 520 controls signals of an output terminal OUT in accordance with configuration data held in nodes mem1 and mem2. A potential VH and a potential VL are signals for controlling the LUT 311 or the multiplexer 313.

The configuration memory 520 in FIG. 7B includes a transistor 531, a transistor 532, a transistor 533, a capacitor 534, a transistor 535, a transistor 536, a transistor 537, and a capacitor 538.

A semiconductor material that has a wider band gap and lower intrinsic carrier density than silicon may be used for a channel formation region in each of the transistors 511, 531, and 535. An oxide semiconductor is a preferable example of the semiconductor material. In contrast, for example, a semiconductor material such as silicon may be used for a channel formation region in each of the transistors 512, 513, 532, 533, 536, and 537.

Note that in the drawings, "OS" is written beside each of the transistors 511, 531, and 535 to indicate that each of the transistors 511, 531, and 535 includes an oxide semiconductor in the channel formation region.

The details of the configuration memory 500 are described with reference to FIG. 7A. As illustrated in FIG. 7A, a gate of the transistor 511 is connected to a first word line 502. One of a source and a drain of the transistor 511 is connected to a data line 501. The other of the source and the drain of the transistor 511 is connected to a gate of the transistor 512 and the capacitor 514. One of a source and a drain of the transistor 512 is connected to the terminal S1. The other of the source and the drain of the transistor 512 is connected to one of a source and a drain of the transistor 513. A gate of the transistor 513 is connected to a second word line 503. The other of the source and the drain of the transistor 513 is connected to the terminal S2.

In the configuration memory 500 in FIG. 7A, a potential corresponding to H level or L level is held in the node mem as configuration data. Configuration data can be stored in the node mem by using a transistor whose off-state current is extremely low as the transistor 511. In the configuration memory 500, whether the transistor 512 is turned on or off is controlled in accordance with the potential of configuration data. At the time of turning on the transistor 513, electrical connection between the terminal S1 and the terminal S2 can be controlled.

Next, the details of the configuration memory 520 are described with reference to FIG. 7B. As illustrated in FIG. 7B, a gate of the transistor 531 is connected to a first word line 542. One of a source and a drain of the transistor 531 is connected to a data line 541. The other of the source and the drain of the transistor 531 is connected to a gate of the transistor 532 and the capacitor 534. One of a source and a drain of the transistor 532 is connected to a wiring to which the potential VH is supplied. The other of the source and the drain of the transistor 532 is connected to one of a source and a drain of the transistor 533. A gate of the transistor 533 is connected to a second word line 543. The other of the source and the drain of the transistor 533 is connected to the output terminal OUT. A gate of the transistor 535 is connected to the first word line 542. One of a source and a drain of the transistor 535 is connected to the data line 541 through an inverter circuit 540. The other of the source and the drain of the transistor 535 is connected to a gate of the transistor 536 and the capacitor 538. One of a source and a drain of the transistor 536 is connected to a wiring to which the potential VL is supplied. The other of the source and the drain of the transistor 536 is connected to one of a source and a drain of the transistor 537. A gate of the transistor 537 is connected to the second word line 543. The other of the source and the drain of the transistor 537 is connected to the output terminal OUT.

In the configuration memory 520 in FIG. 7B, as configuration data, a potential corresponding to an H level and a potential corresponding to an L level are held in the nodes mem1 and mem2, respectively, or a potential corresponding to an L level and a potential corresponding to an H level are held in the nodes mem1 and mem2, respectively. Configuration data can be stored in the nodes mem1 and mem2 by using a transistor whose off-state current is extremely low as each of the transistors 531 and 535. In the configuration memory 520, whether each of the transistors 532 and 536 is turned on or off is controlled in accordance with the potential of configuration data. At the time of turning on each of the transistors 533 and 537, a signal output from the output terminal OUT can be set to the potential VH or the potential VL.

This embodiment can be combined as appropriate with any of the other embodiments and an example in this specification.

Embodiment 4

In this embodiment, a CPU of one embodiment of the present invention is described with reference to drawings.

Figure 8:
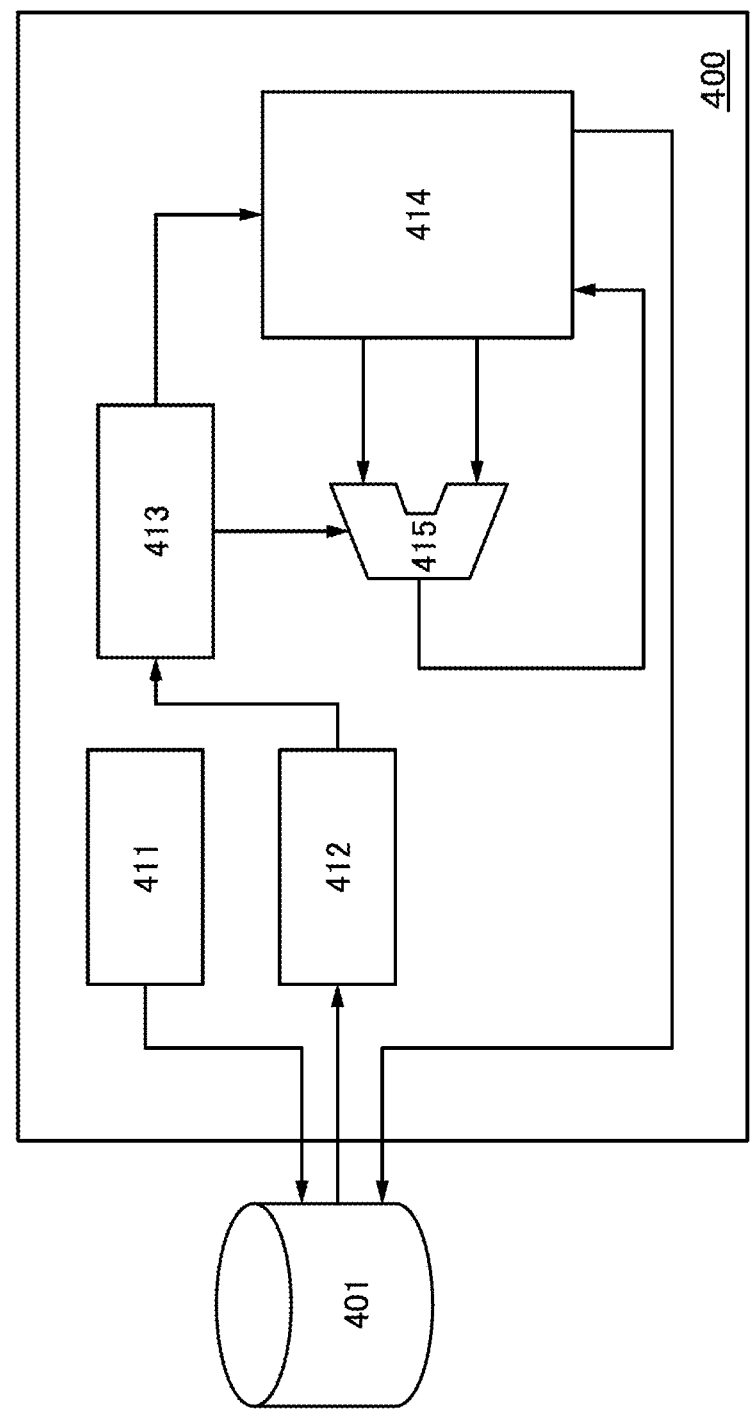
FIG. 8 is a block diagram illustrating a specific example of a semiconductor device.

FIG. 8 illustrates an example of a block diagram of a CPU 400.

A CPU 400 includes, for example, a program counter 411, an instruction register 412, an instruction decoder 413, a general-purpose register 414, and an arithmetic logic unit (ALU) 415. A main memory device 401 for inputting and outputting data to and from the CPU 400 is provided outside the CPU 400.

The program counter 411 has a function of specifying the address of an instruction (command) to be read (fetched) from the main memory device 401. The instruction register 412 has a function of temporarily storing data transmitted to the instruction decoder 413 from the main memory device 401. The instruction decoder 413 has a function of decoding the input data and specifying a register in the general-purpose register 414. The instruction decoder 413 also has a function of generating a signal for specifying an arithmetic method in the ALU 415. The general-purpose register 414 has a function of storing data read from the main memory device 401, data obtained during the arithmetic operations in the ALU 415, data obtained as a result of the arithmetic operations of the ALU 415, or the like. The ALU 415 has a function of performing a variety of arithmetic operations such as four arithmetic operations and logic operations. In the CPU 400, a data cache or the like, that is, a circuit that temporarily stores an arithmetic result or the like, may be additionally provided.

Next, operation of the CPU 400 is described.

First, the program counter 411 specifies the address of an instruction stored in the main memory device 401. Then, the instruction specified by the program counter 411 is read from the main memory device 401 and stored in the instruction register 412.

The instruction decoder 413 decodes the data stored in the instruction register 412 and passes the decoded data to the general-purpose register 414 and the ALU 415. Specifically, the instruction decoder 413 generates a signal for specifying a register in the general-purpose register 414, and a signal for specifying an arithmetic method in the ALU 415, and the like.

The general-purpose register 414 outputs the data specified by the instruction decoder 413 to the ALU 415 or the main memory device 401. In the ALU 415, arithmetic operations are carried out in accordance with the arithmetic method specified by the instruction decoder 413, and arithmetic results are stored in the general-purpose register 414.

After the termination of the instruction, the CPU 400 repeats the series of operations (reading of the instruction, decoding of the instruction, and execution of the instruction).

In one embodiment of the present invention, the semiconductor device described in Embodiment 1 or Embodiment 2 is applied to registers for temporarily storing data in circuits, such as the program counter 411, the instruction register 412, the instruction decoder 413, and the general-purpose register 414; thus, loss of data in the registers caused by stop of the supply of a power supply potential can be prevented. Furthermore, data held before the stop of the supply of the power supply potential can be backed up in a short time, and the data can be restored in a short time after the supply of the power supply potential is restarted. Thus, in the entire CPU 400 or the circuits included in the CPU 400, the supply of the power supply potential can be stopped. Consequently, the power consumption of the CPU 400 can be low.

Figure 9:
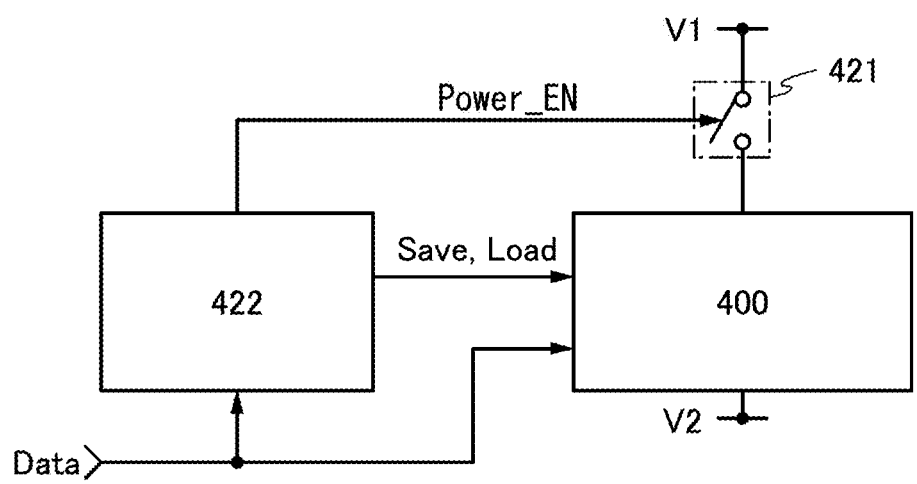
FIG. 9 is a block diagram illustrating a specific example of a semiconductor device.

FIG. 9 illustrates an example of a structure for stopping or restarting the supply of a power supply potential to the CPU 400. In FIG. 9, the CPU 400, a power switch 421, and a power supply control circuit 422 are provided.

The power switch 421 can control stop or restart of the supply of the power supply potential to the CPU 400 in accordance with its on state or off state. Specifically, the power supply control circuit 422 outputs a power control signal Power_EN for turning on or off the power switch 421 to control the stop or the restart of the supply of the power supply potential to the CPU 400. By turning on the power switch 421, a power supply potential is supplied to the CPU 400 from wirings to which the potentials V1 and V2 are supplied. Furthermore, by turning off the power switch 421, a path of current between the wirings to which the potentials V1 and V2 are supplied is cut, so that the supply of the power supply potential to the CPU 400 is stopped.

The power supply control circuit 422 has a function of collectively controlling operations of the power switch 421 and the CPU 400 in accordance with the frequency of input data Data. Specifically, the power supply control circuit 422 outputs a power control signal Power_EN for turning on or off the power switch 421 and control signals Save and Load for controlling data backed up and restored in the register. As described above, the control signals Save and Load are signals for backing up and restoring potentials in the registers in the volatile memory circuit and the nonvolatile memory circuit portion.

Next, operation examples of the CPU 400, the power switch 421, and the power supply control circuit 422 that are illustrated in FIG. 9 are described.

When the supply of the power supply potential is continued, stopped, or restarted, determination is made in accordance with the frequency of data Data input to the power supply control circuit 422. Specifically, in the case where data Data is continuously input to the CPU 400, the power supply control circuit 422 outputs the power control signal so that the supply of the power supply potential is continued. In the case where data Data is input to the CPU 400 intermittently, at timing when the data Data is input, the power supply control circuit 422 outputs the power control signal so that the supply of the power supply potential is stopped or restarted.

It is preferable that the power supply control circuit 422 have a structure in which a power supply potential is continuously supplied even while the supply of the power supply potential to the CPU 400 is stopped. With this structure, the supply of the power supply potential to the CPU 400 can be stopped or restarted at desired timing.

This embodiment can be combined as appropriate with any of the other embodiments and an example in this specification.

Embodiment 5

In this embodiment, the oxide semiconductor transistor used in the above embodiment is described with reference to drawings. Note that the oxide semiconductor transistor described in this embodiment is an example, and the shape of a transistor that can be used in the above embodiment is not limited to the shapes in this embodiment.

<Example of Structure of Oxide Semiconductor Transistor>

Figure 10A:
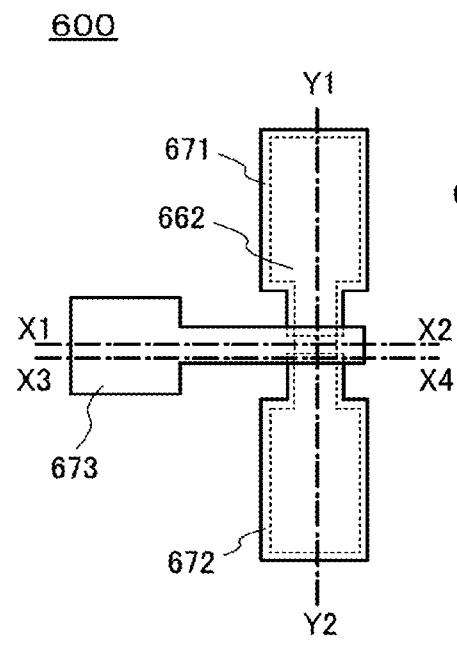
FIGS. 10A to 10D are a top view and cross-sectional views of a transistor.
Figure 10B:
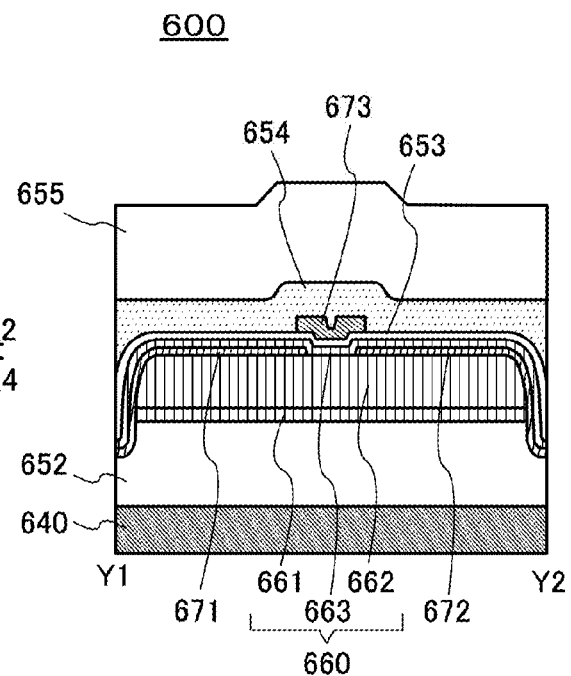
Figure 10C:
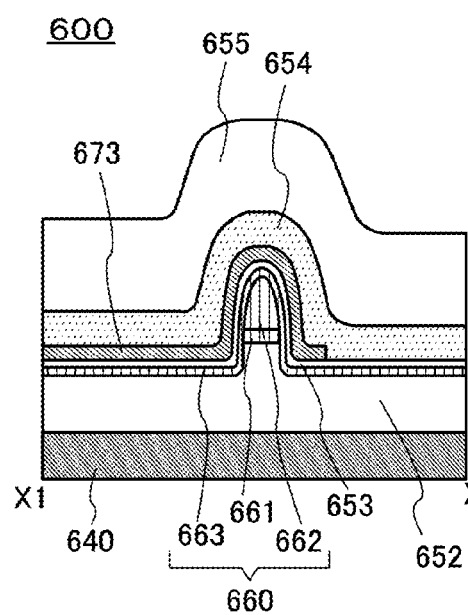
Figure 10D:
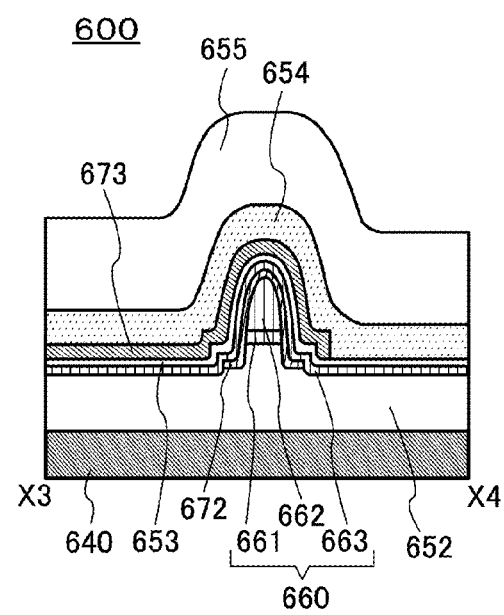

FIGS. 10A to 10D are a top view and cross-sectional views of a transistor 600. FIG. 10A is the top view. FIG. 10B illustrates a cross section along the dashed-dotted line Y1-Y2 in FIG. 10A. FIG. 10C illustrates a cross section along the dashed-dotted line X1-X2 in FIG. 10A. FIG. 10D illustrates a cross section along the dashed-dotted line X3-X4 in FIG. 10A. In FIGS. 10A to 10D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, the channel width in a region where a channel is formed actually (hereinafter referred to as an effective channel width) is different from the channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

The transistor 600 includes an insulating film 652 over a substrate 640; a stack in which a first oxide semiconductor 661 and a second oxide semiconductor 662 are formed in this order over the insulating film 652; a source electrode 671 and a drain electrode 672 electrically connected to part of the stack; a third oxide semiconductor 663 that covers part of the stack, part of the source electrode 671, and part of the drain electrode 672; a gate insulating film 653 and a gate electrode 673 that cover part of the stack, part of the source electrode 671, part of the drain electrode 672, and the third oxide semiconductor 663; an insulating film 654 over the source electrode 671, the drain electrode 672, and the gate electrode 673; and an insulating film 655 over the insulating film 654. Note that the first oxide semiconductor 661, the second oxide semiconductor 662, and the third oxide semiconductor 663 are collectively referred to as an oxide semiconductor 660.

Note that at least part (or all) of the source electrode 671 (and/or the drain electrode 672) is provided on at least part (or all) of a surface, side surfaces, a top surface, and/or a bottom surface of a semiconductor layer such as the second oxide semiconductor 662 (and/or the first oxide semiconductor 661).

Alternatively, at least part (or all) of the source electrode 671 (and/or the drain electrode 672) is in contact with at least part (or all) of a surface, side surfaces, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is in contact with at least part (or all) of a semiconductor layer such as the second oxide semiconductor 662 (and/or the first oxide semiconductor 661).

Alternatively, at least part (or all) of the source electrode 671 (and/or the drain electrode 672) is electrically connected to at least part (or all) of a surface, side surfaces, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is electrically connected to part (or all) of a semiconductor layer such as the second oxide semiconductor 662 (and/or the first oxide semiconductor 661).

Alternatively, at least part (or all) of the source electrode 671 (and/or the drain electrode 672) is provided near part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided near part (or all) of a semiconductor layer such as the second oxide semiconductor 662 (and/or the first oxide semiconductor 661).

Alternatively, at least part (or all) of the source electrode 671 (and/or the drain electrode 672) is provided next to part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided next to part (or all) of a semiconductor layer such as the second oxide semiconductor 662 (and/or the first oxide semiconductor 661).

Alternatively, at least part (or all) of the source electrode 671 (and/or the drain electrode 672) is provided obliquely above part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided obliquely above part (or all) of a semiconductor layer such as the second oxide semiconductor 662 (and/or the first oxide semiconductor 661).

Alternatively, at least part (or all) of the source electrode 671 (and/or the drain electrode 672) is provided above part (or all) of a surface, a side surface, a top surface, and/or a bottom surface of a semiconductor layer such as the second oxide semiconductor 662 (and/or the first oxide semiconductor 661). Alternatively, at least part (or all) of the source electrode 671 (and/or the drain electrode 672) is provided above part (or all) of a semiconductor layer such as the second oxide semiconductor 662 (and/or the first oxide semiconductor 661).

Note that functions of a "source" and a "drain" of a transistor are sometimes replaced with each other when a transistor of opposite polarity is used or when the direction of current flowing is changed in circuit operation, for example.

Therefore, the terms "source" and "drain" can be replaced with each other in this specification.

The transistor of one embodiment of the present invention has a top gate structure with a channel length of greater than or equal to 10 nm and less than or equal to 1000 nm, preferably greater than or equal to 20 nm and less than or equal to 500 nm, further preferably greater than or equal to 30 nm and less than or equal to 300 nm.

Components of the semiconductor device of this embodiment are described below in detail.

<Substrate>

The substrate 640 is not limited to a simple supporting substrate and may be a substrate where a device such as a transistor is formed. In that case, one of the gate electrode 673, the source electrode 671, and the drain electrode 672 of the transistor 600 may be electrically connected to the device.

<Base Insulating Film>

The insulating film 652 can have a function of supplying oxygen to the oxide semiconductor 660 as well as a function of preventing diffusion of impurities from the substrate 640. For this reason, the insulating film 652 is preferably an insulating film containing oxygen and more preferably an insulating film having an oxygen content higher than that in the stoichiometric composition. For example, the insulating film 652 is a film of which the amount of released oxygen when converted into oxygen atoms is $1.0 \times 10^{19}$ atoms/cm$^3$ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. When the substrate 640 is a substrate where a device is formed as described above, the insulating film 652 is preferably subjected to planarization treatment such as chemical mechanical polishing (CMP) treatment so as to have a flat surface.

The insulating film 652 can be formed using an oxide insulating film of aluminum oxide, aluminum oxynitride, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride oxide, or the like, or a film in which any of the above materials are mixed.

<Oxide Semiconductor>

The oxide semiconductor 660 is typically formed using an In—Ga oxide, an In—Zn oxide, or an In-M-Zn oxide (M is Ti, Ga, Y, Zr, La, Ce, Nd, Sn, or Hf), and is preferably formed using an In-M-Zn oxide.

Note that the oxide semiconductor 660 is not limited to the oxide containing indium. The oxide semiconductor 660 may be, for example, a Zn—Sn oxide or a Ga—Sn oxide.

In the case where the oxide semiconductor 660 is an In-M-Zn oxide (M is Ti, Ga, Y, Zr, La, Ce, Nd, Sn, or Hf) formed by sputtering, it is preferred that the atomic ratio of metal elements of a target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, and In:M:Zn=2:1:3 are preferable. Note that the atomic ratios of metal elements in the oxide semiconductor 660 vary from those in the sputtering target within an error range of ±40%.

Figure 11A:
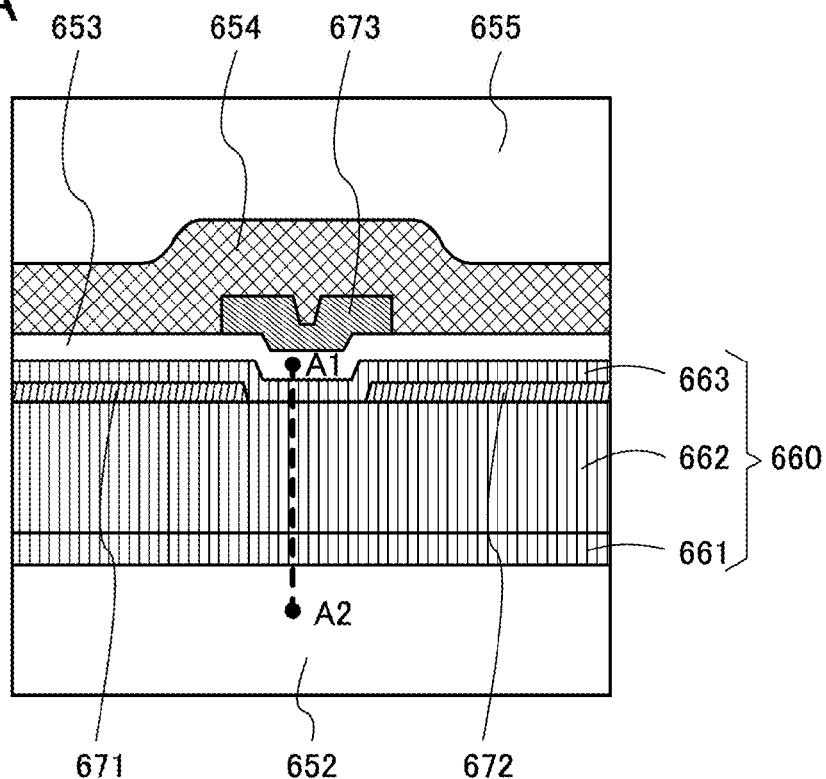
FIGS. 11A and 11B are a cross-sectional view of a transistor and an energy band diagram of the transistor.

Next, a function and an effect of the oxide semiconductor 660 in which the first oxide semiconductor 661, the second oxide semiconductor 662, and the third oxide semiconductor 663 are stacked will be described using an energy band diagram in FIG. 11B. FIG. 11A is an enlarged view of the channel portion of the transistor 600 illustrated in FIG. 10B.

Figure 11B:
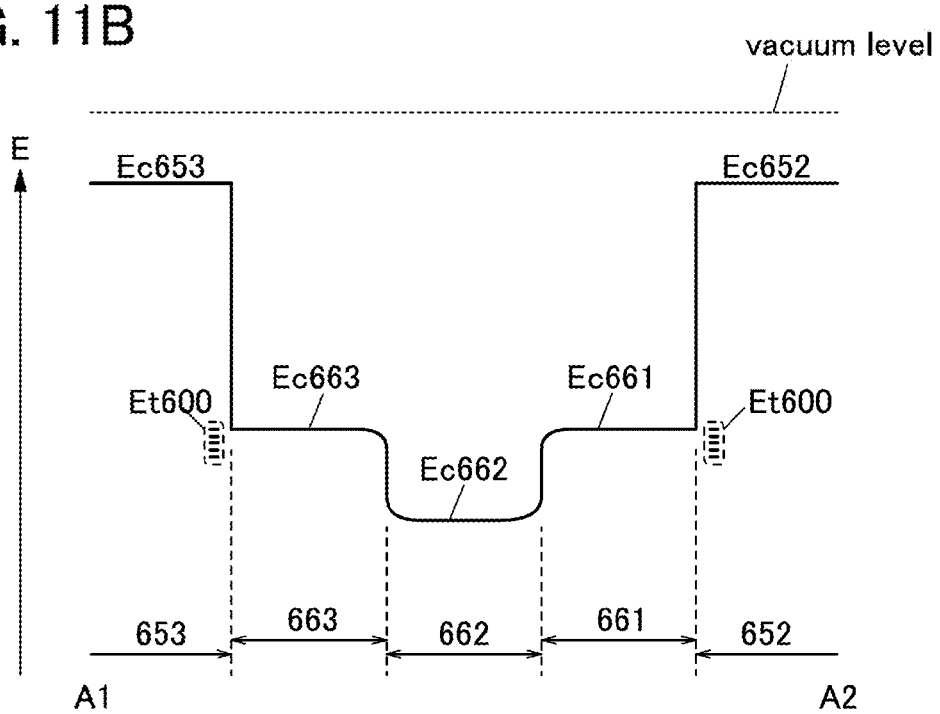

FIG. 11B shows an energy band diagram of a portion along the chain line A1-A2 in FIG. 11A.

In FIG. 11B, Ec652, Ec661, Ec662, Ec663, and Ec653 indicate the energy of the conduction band minimum of the insulating film 652, the first oxide semiconductor 661, the second oxide semiconductor 662, the third oxide semiconductor 663, and the gate insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (VersaProbe manufactured by ULVAC-PHI, Inc.).

An In—Ga—Zn oxide formed using a sputtering target with an atomic ratio of In:Ga:Zn=1:3:2 has an energy gap of approximately 3.5 eV and an electron affinity of approximately 4.5 eV. An In—Ga—Zn oxide formed using a sputtering target with an atomic ratio of In:Ga:Zn=1:3:4 has an energy gap of approximately 3.4 eV and an electron affinity of approximately 4.5 eV. An In—Ga—Zn oxide formed using a sputtering target with an atomic ratio of In:Ga:Zn=1:3:6 has an energy gap of approximately 3.3 eV and an electron affinity of approximately 4.5 eV. An In—Ga—Zn oxide formed using a sputtering target with an atomic ratio of In:Ga:Zn=1:6:2 has an energy gap of approximately 3.9 eV and an electron affinity of approximately 4.3 eV. An In—Ga—Zn oxide formed using a sputtering target with an atomic ratio of In:Ga:Zn=1:6:8 has an energy gap of approximately 3.5 eV and an electron affinity of approximately 4.4 eV. An In—Ga—Zn oxide which is formed using a sputtering target having an atomic ratio of In:Ga:Zn=1:6:10 has an energy gap of approximately 3.5 eV and an electron affinity of approximately 4.5 eV. An In—Ga—Zn oxide formed using a sputtering target with an atomic ratio of In:Ga:Zn=1:1:1 has an energy gap of approximately 3.2 eV and an electron affinity of approximately 4.7 eV. An In—Ga—Zn oxide formed using a sputtering target with an atomic ratio of In:Ga:Zn=3:1:2 has an energy gap of approximately 2.8 eV and an electron affinity of approximately 5.0 eV.

Since the insulating film 652 and the gate insulating film 653 are insulators, Ec652 and Ec653 are closer to the vacuum level than Ec661, Ec662, and Ec663 (i.e., the insulating film 652 and the gate insulating film 653 have a smaller electron affinity than the first oxide semiconductor 661, the second oxide semiconductor 662, and the third oxide semiconductor 663).

Ec661 is closer to the vacuum level than Ec662. Specifically, Ec661 is preferably located closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Ec663 is closer to the vacuum level than Ec662. Specifically, Ec663 is preferably located closer to the vacuum level than Ec662 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the first oxide semiconductor 661 and the second oxide semiconductor 662 and the interface between the second oxide semiconductor 662 and the third oxide semiconductor 663; thus, the energy of the conduction band minimum changes continuously. In other words, no state or few states exist at these interfaces.

Accordingly, electrons transfer mainly through the second oxide semiconductor 662 in the stacked-layer structure having the above energy band. Therefore, even if an interface state exists between the first oxide semiconductor 661 and the insulating film 652 or between the third oxide semiconductor 663 and the gate insulating film 653, the interface state hardly influences the transfer of electrons. In addition, since no interface state or few interface states exist between the first oxide semiconductor 661 and the second oxide semiconductor 662 and between the second oxide semiconductor 662 and the third oxide semiconductor 663, the transfer of electrons is not interrupted in the regions. Consequently, the transistor 600 including the above stacked oxide semiconductors can have high field-effect mobility.

Although trap states Et600 due to impurities or defects might be formed in the vicinity of the interface between the first oxide semiconductor 661 and the insulating film 652 and the interface between the third oxide semiconductor 663 and the gate insulating film 653 as illustrated in FIG. 11B, the second oxide semiconductor 662 can be separated from the trap states owing to the existence of the first oxide semiconductor 661 and the third oxide semiconductor 663.

In the transistor 600 described in this embodiment, in the channel width direction, the top surface and side surfaces of the second oxide semiconductor 662 are in contact with the third oxide semiconductor 663, and the bottom surface of the second oxide semiconductor 662 is in contact with the first oxide semiconductor 661 (see FIG. 10C). Surrounding the second oxide semiconductor 662 by the first oxide semiconductor 661 and the third oxide semiconductor 663 in this manner can further reduce the influence of the trap states.

However, when the energy difference between Ec662 and Ec661 or Ec663 is small, an electron in the second oxide semiconductor 662 might reach the trap state by passing over the energy difference. Since the electron is trapped at the trap state, a negative fixed charge is generated at the interface with the insulating film, causing the threshold voltage of the transistor to be shifted in the positive direction.

Therefore, each of the energy gaps between Ec661 and Ec662 and between Ec662 and Ec663 is preferably 0.1 eV or more, further preferably 0.15 eV or more, in which case a change in the threshold voltage of the transistor can be reduced and the transistor can have favorable electrical characteristics.

The band gap of each of the first oxide semiconductor 661 and the third oxide semiconductor 663 is preferably wider than that of the second oxide semiconductor 662.

For the first oxide semiconductor 661 and the third oxide semiconductor 663, a material containing Al, Ti, Ga, Ge, Y, Zr, Sn, La, Ce, or Hf with a higher atomic ratio than that used for the second oxide semiconductor 662 can be used, for example. Specifically, any of the above metal elements in an atomic ratio 1.5 times or more, preferably 2 times or more, further preferably 3 times or more as much as a metal element of the second oxide semiconductor 662 is contained. Any of the above metal elements is strongly bonded to oxygen and thus has a function of preventing generation of oxygen vacancy in the oxide semiconductor. That is, an oxygen vacancy is less likely to be generated in the first oxide semiconductor 661 and the third oxide semiconductor 663 than in the second oxide semiconductor 662.

When each of the first oxide semiconductor 661, the second oxide semiconductor 662, and the third oxide semiconductor 663 is an In-M-Zn oxide containing at least indium, zinc, and M (M is a metal such as Al, Ti, Ga, Ge, Y, Zr, Sn, La, Ce, or Hf) and the atomic ratio of In to M and Zn of the first oxide semiconductor 661 is $x_1:y_1:z_1$, that of the second oxide semiconductor 662 is $x_2:y_2:z_2$, and that of the third oxide semiconductor 663 is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. In this case, the transistor can have stable electrical characteristics when $y_2$ is greater than or equal to $x_2$ in the second oxide semiconductor 662. However, when yz is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in the first oxide semiconductor 661 and the third oxide semiconductor 663 are preferably lower than 50 atomic % and higher than or equal to 50 atomic %, respectively, and further preferably lower than 25 atomic % and higher than or equal to 75 atomic %, respectively. In the case where Zn and O are not taken into consideration, the proportion of In and the proportion of M in the second oxide semiconductor 662 are preferably greater than or equal to 25 atomic % and less than 75 atomic %, respectively, and further preferably greater than or equal to 34 atomic % and less than 66 atomic %, respectively.

The thickness of each of the first oxide semiconductor 661 and the third oxide semiconductor 663 ranges from 3 nm to 100 nm, preferably from 3 nm to 50 nm. The thickness of the second oxide semiconductor 662 ranges from 3 nm to 200 nm, preferably from 3 nm to 100 nm, further preferably from 3 nm to 50 nm. The second oxide semiconductor 662 is preferably thicker than the first oxide semiconductor 661 and the third oxide semiconductor 663.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1 \times 10^{17}/cm^3$, preferably lower than $1 \times 10^{15}/cm^3$, further preferably lower than $1 \times 10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor layer. In addition, silicon in the oxide semiconductor forms an impurity level. The impurity levels serve as traps and might cause the electrical characteristics of the transistor to deteriorate. Therefore, it is preferable to reduce the concentration of the impurities in the first oxide semiconductor 661, the second oxide semiconductor 662, and the third oxide semiconductor 663 and at interfaces between the layers.

In order to make the oxide semiconductor intrinsic or substantially intrinsic, for example, the concentration of silicon at a certain depth of the oxide semiconductor or in a region of the oxide semiconductor, which is measured by secondary ion mass spectrometry (SIMS), is lower than $1 \times 10^{19}$ atoms/$cm^3$, preferably lower than $5 \times 10^{18}$ atoms/$cm^3$, further preferably lower than $1 \times 10^{18}$ atoms/$cm^3$. The concentration of hydrogen at a certain depth of the oxide semiconductor or in a region of the oxide semiconductor is lower than or equal to $2 \times 10^{20}$ atoms/$cm^3$, preferably lower than or equal to $5 \times 10^{19}$ atoms/$cm^3$, further preferably lower than or equal to $1 \times 10^{19}$ atoms/$cm^3$, still further preferably lower than or equal to $5\times10^{18}$ atoms/cm$^3$. The concentration of nitrogen at a certain depth of the oxide semiconductor or in a region of the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, in the case where the oxide semiconductor includes a crystal, high concentration of silicon or carbon might reduce the crystallinity of the oxide semiconductor. In order not to lower the crystallinity of the oxide semiconductor, for example, the concentration of silicon at a certain depth of the oxide semiconductor or in a region of the oxide semiconductor is lower than $1\times10^{19}$ atoms/cm$^3$, preferably lower than $5\times10^{18}$ atoms/cm$^3$, further preferably lower than $1\times10^{18}$ atoms/cm$^3$. Furthermore, the concentration of carbon at a certain depth of the oxide semiconductor or in a region of the oxide semiconductor is lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which the above-described highly purified oxide semiconductor is used for a channel formation region exhibits an extremely low off-state current. When a voltage between a source and a drain is set at about 0.1 V, 5 V, or 10 V, for example, the off-state current normalized on the channel width of the transistor can be as low as several yoctoamperes per micrometer to several zeptoamperes per micrometer.

In the transistor 600 described in this embodiment, the gate electrode 673 is formed to electrically surround the oxide semiconductor 660 in the channel width direction; consequently, a gate electric field is applied to the semiconductor 660 in the side surface direction in addition to the perpendicular direction (see FIG. 10C). In other words, a gate electric field is applied to the whole oxide semiconductor 660, so that current flows through the entire second oxide semiconductor 662 serving as a channel, leading to a further increase in on-state current.

<Gate Insulating Film>

The gate insulating film 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 653 may be a stack including any of the above materials. The gate insulating film 653 may contain lanthanum (La), nitrogen, or zirconium (Zr) as an impurity.

An example of a stacked-layer structure of the gate insulating film 653 is described. The gate insulating film 653 contains oxygen, nitrogen, silicon, or hafnium, for example. Specifically, the gate insulating film 653 preferably includes hafnium oxide and silicon oxide or silicon oxynitride.

Hafnium oxide has a higher dielectric constant than silicon oxide and silicon oxynitride. Therefore, by using hafnium oxide or aluminum oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

<Source Electrode and Drain Electrode>

The source electrode 671 and the drain electrode 672 can be formed using a material used for the gate electrode 673. A Cu—Mn alloy film is preferably used because of its low electrical resistance and because it forms manganese oxide at the interface with the oxide semiconductor 660 and manganese oxide can prevent Cu diffusion.

<Protective Insulating Film>

The insulating film 654 has a function of blocking oxygen, hydrogen, water, alkali metal, alkaline earth metal, and the like. Providing the insulating film 654 can prevent outward diffusion of oxygen from the oxide semiconductor 660 and entry of hydrogen, water, or the like into the oxide semiconductor 660 from the outside. The insulating film 654 can be, for example, a nitride insulating film. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 654 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor 660, preventing release of oxygen, which is the main component of the oxide semiconductor 660, from the oxide semiconductor, and preventing unnecessary release of oxygen from the insulating film 652. In addition, oxygen contained in the aluminum oxide film can be diffused into the oxide semiconductor.

<Interlayer Insulating Film>

The insulating film 655 is preferably formed over the insulating film 654. The insulating film 655 can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating film may be a stack of any of the above materials.

<Second Gate Electrode>

Figure 12A:
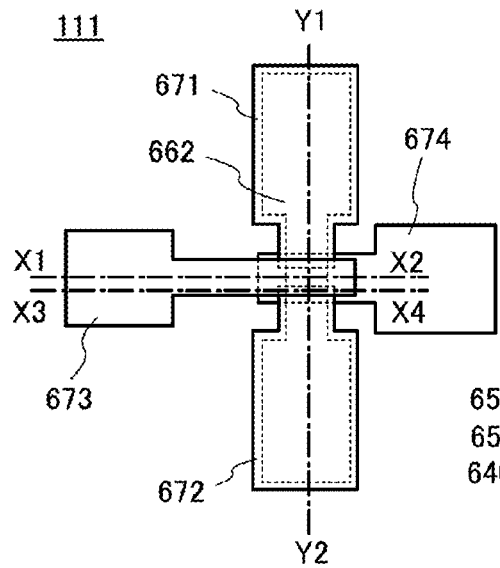
FIGS. 12A to 12D are a top view of and cross-sectional views of a transistor.
Figure 12B:
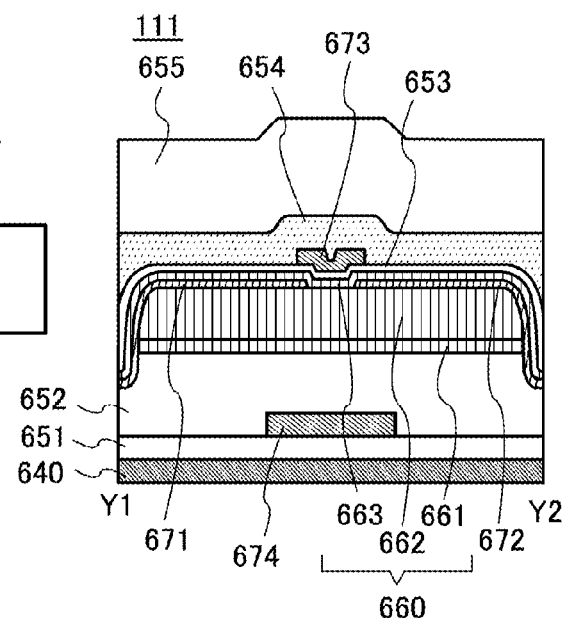
Figure 12C:
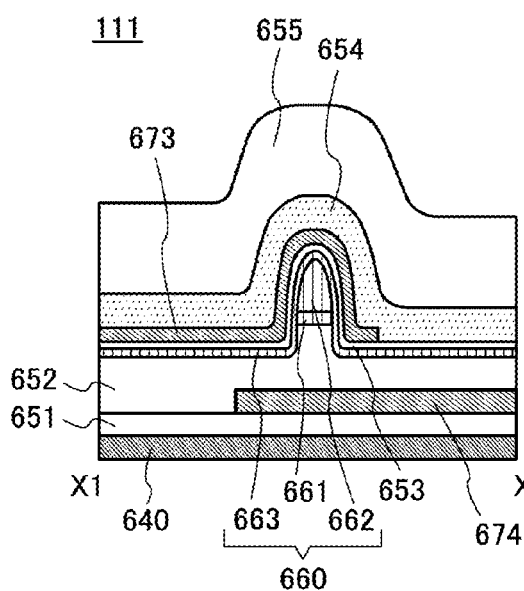
Figure 12D:
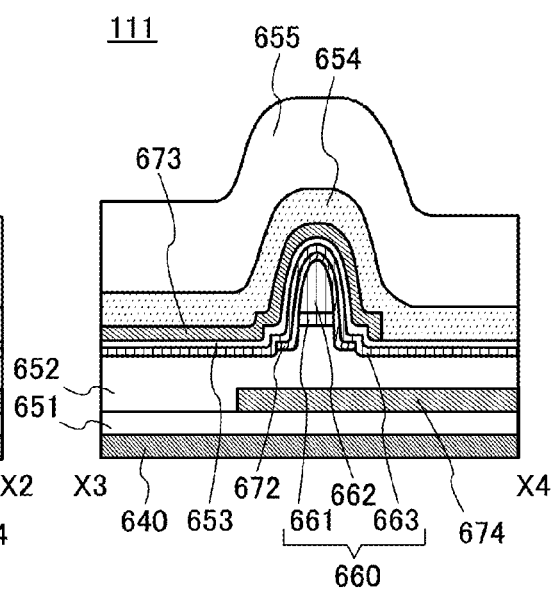

Although the example where one gate electrode is provided in the transistor is illustrated in FIGS. 10A to 10D, one embodiment of the present invention is not limited thereto. A plurality of gate electrodes may be provided in the transistor. FIGS. 12A to 12D illustrate an example where the transistor 600 illustrated in FIGS. 10A to 10D is provided with a conductive film 674 as a second gate electrode. FIG. 12A is the top view. FIG. 12B illustrates a cross section along the dashed-dotted line Y1-Y2 in FIG. 12A. FIG. 12C illustrates a cross section along the dashed-dotted line X1-X2 in FIG. 12A. FIG. 12D illustrates a cross section along the dashed-dotted line X3-X4 in FIG. 12A. In FIGS. 12A to 12D, some components are scaled up or down or omitted for easy understanding.

A material or a stacked-layer structure of the gate electrode 673 can be used for the conductive film 674. The conductive film 674 functions as a gate electrode layer. The conductive film 674 may be supplied with a constant potential, or a potential or a signal that is the same as that supplied to the gate electrode 673.

The structure and method described in this embodiment can be implemented by being combined as appropriate with any of the other structures and methods described in the other embodiments.

Embodiment 6

In this embodiment, the semiconductor device described in the above embodiment is described with reference to FIGS. 13A to 13D. Note that the semiconductor device described in this embodiment is an example, and the structure of the semiconductor device of one embodiment of the present invention is not limited to the structure in this embodiment.

<Cross-Sectional Structure>

FIG. 13A is a cross-sectional view of a semiconductor device of one embodiment of the present invention. The semiconductor device in FIG. 13A includes a transistor 2200 using a first semiconductor material, a transistor 2400 using a second semiconductor material, a substrate 2000, an element separation layer 2001, a plug 2002, a wiring 2003, a plug 2004, an insulating film 2005, a wiring 2006, and a wiring 2008. The transistor 2200 includes a gate electrode 2205, a gate insulating film 2204, a sidewall insulating layer 2206, an impurity region 2203 serving as a source region or a drain region, an impurity region 2202 serving as a lightly doped drain (LDD) region or an extension region, and a channel formation region 2201.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using single crystal silicon or the like as a semiconductor material can easily operate at high speed. In contrast, a transistor using an oxide semiconductor has low off-state current. FIG. 13A illustrates an example in which the transistor 600 described in Embodiment 5 is used as the transistor 2400 containing the second semiconductor material. A cross-sectional view of the transistors in a channel length direction is on the left side of a dashed-dotted line, and a cross-sectional view of the transistors in a channel width direction is on the right side of the dashed-dotted line.

As the substrate 2000, a single crystal semiconductor substrate or a polycrystalline semiconductor substrate of silicon or silicon carbide, a compound semiconductor substrate of silicon germanium, a silicon-on-insulator (SOI) substrate, or the like may be used. A transistor formed using a semiconductor substrate can easily operate at high speed. In the case of using a p-type single crystal silicon substrate as the substrate 2000, an impurity element imparting n-type conductivity may be added to part of the substrate 2000 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Alternatively, the substrate 2000 may be a metal substrate or an insulating substrate provided with a semiconductor film. Examples of the metal substrate are a stainless steel substrate, a substrate including stainless steel foil, a tungsten substrate, and a substrate including tungsten foil. Examples of the insulating substrate are a glass substrate, a quartz substrate, a plastic substrate, a flexible substrate, an attachment film, paper including a fibrous material, and a base film. Examples of the glass substrate are a barium borosilicate glass substrate, an aluminoborosilicate glass substrate, and a soda lime glass substrate. Examples of the flexible substrate are flexible synthetic resin substrates such as substrates of plastics typified by polyethylene terephthalate (PET), polyethylene naphthalate (PEN), and polyether sulfone (PES) and an acrylic substrate. Examples of the attachment film are attachment films formed using polypropylene, polyester, polyvinyl fluoride, polyvinyl chloride, and the like. Examples of the base film are base films formed using polyester, polyamide, polyimide, aramid, epoxy, an inorganic vapor deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

The transistor 2200 is separated from other transistors formed on the substrate 2000 by the element separation layer 2001. The element separation layer 2001 can be formed using an insulator containing one or more materials selected from aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

As the transistor 2200, a transistor containing silicide (salicide) or a transistor that does not include the sidewall insulating layer 2206 may be used. When a structure that contains silicide (salicide) is used, the resistance of the source region and the drain region can be further lowered and the speed of the semiconductor device is increased. Furthermore, the semiconductor device can operate at low voltage; thus, power consumption of the semiconductor device can be reduced.

The transistor 2200 may be either an n-channel transistor or a p-channel transistor, and an appropriate transistor may be used in accordance with a circuit. The impurity region 2203 has higher impurity concentration than the impurity region 2202. The impurity regions 2202 and 2203 can be formed in a self-aligned manner with the use of the gate electrode 2205 and the sidewall insulating layer 2206 as masks.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2400 provided in an upper portion, hydrogen in an insulating film provided in the vicinity of the semiconductor film of the transistor 2400 becomes a factor of generating carriers in the oxide semiconductor; thus, the reliability of the transistor 2400 might be decreased. Therefore, in the case where the transistor 2400 using an oxide semiconductor is provided over the transistor 2200 using a silicon-based semiconductor material, it is particularly effective that the insulating film 2005 having a function of preventing diffusion of hydrogen is provided between the transistors 2200 and 2400. The insulating film 2005 makes hydrogen remain in the lower portion, thereby improving the reliability of the transistor 2200. In addition, since the insulating film 2005 suppresses diffusion of hydrogen from the lower portion to the upper portion, the reliability of the transistor 2400 also can be improved.

The insulating film 2005 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ). In particular, the aluminum oxide film is preferably used because the aluminum oxide film has a high shielding (blocking) effect of preventing penetration of both oxygen and impurities such as hydrogen and moisture.

The plugs 2002 and 2004 and the wirings 2003 and 2008 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. The plugs and the wirings are particularly preferably formed using a Cu—Mn alloy, in which case manganese oxide formed at the interface with an insulator containing oxygen has a function of preventing Cu diffusion.

In FIGS. 13A and 13D, regions without reference numerals and hatch patterns represent regions formed of an insulator. The regions can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the regions, an organic resin such as a polyimide resin, a polyamide resin, an acrylic resin, a siloxane resin, an epoxy resin, or a phenol resin can be used.

Note that the transistor 2200 can be a transistor of various types without being limited to a planar type transistor. For example, a FIN-type transistor, a TRI-GATE transistor, or the like can be used. An example of a cross-sectional view in this case is illustrated in FIG. 13D.

In FIG. 13D, an insulating film 2007 is provided over the substrate 2000. The substrate 2000 includes a projection with a thin tip (also referred to a fin). Note that an insulating film may be provided over the projection. The insulating film functions as a mask for preventing the substrate 2000 from being etched when the projection is formed. Alternatively, the projection does not necessarily have the thin tip; a projection with a cuboid-like projection and a projection with a thick tip are permitted, for example. A gate insulating film 2604 is provided over the projection of the substrate 2000, and a gate electrode 2605 and a sidewall insulating layer 2606 are provided over the gate insulating film 2604. In the substrate 2000, an impurity region 2603 serving as a source region or a drain region, an impurity region 2602 serving as an LDD region or an extension region, and a channel formation region 2601 are formed. Note that here is shown an example in which the substrate 2000 includes the projection; however, a semiconductor device of one embodiment of the present invention is not limited thereto. For example, a semiconductor region having a projection may be formed by processing an SOI substrate.

<Circuit Configuration Example>

In the above-described structure, electrodes of the transistor 2200 and the transistor 2400 can be connected in a variety of ways; thus, a variety of circuits can be formed. Examples of circuit configurations that can be achieved by using a semiconductor device of one embodiment of the present invention are described below.

A circuit diagram in FIG. 13B shows a configuration of what is called a CMOS circuit (inverter circuit) in which the p-channel transistor 2200 and the n-channel transistor 2400 are connected to each other in series and in which gates of the transistors are connected to each other.

A circuit diagram in FIG. 13C illustrates a configuration in which sources of the transistors 2200 and 2400 are connected to each other and drains of the transistors 2200 and 2400 are connected to each other. With such a configuration, the transistors can function as what is called an analog switch.

The structure and method described in this embodiment can be implemented by being combined as appropriate with any of the other structures and methods described in the other embodiments.

Embodiment 7

The semiconductor device of one embodiment of the present invention can be used for display devices, personal computers, image reproducing devices provided with recording media (typically, devices that reproduce the content of recording media such as digital versatile discs (DVDs) and have displays for displaying the reproduced images), or the like. Other examples of electronic appliances that can be equipped with the semiconductor device of one embodiment of the present invention are mobile phones, game machines including portable game machines, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 14A to 14F illustrate specific examples of these electronic appliances.

Figure 14A:
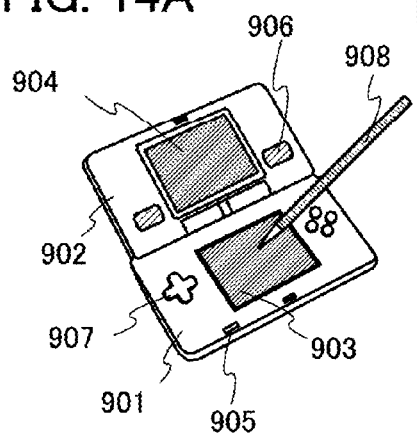
FIGS. 14A to 14F each illustrate an example of an electronic appliance.

FIG. 14A illustrates a portable game machine including a housing 901, a housing 902, a display portion 903, a display portion 904, a microphone 905, speakers 906, an operation key 907, a stylus 908, and the like. Although the portable game machine in FIG. 14A has the two display portions 903 and 904, the number of display portions included in a portable game machine is not limited to this.

Figure 14B:
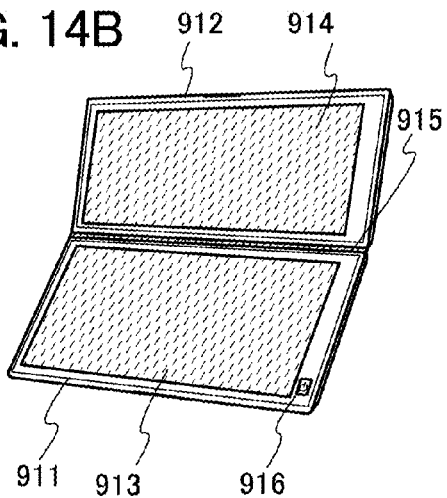

FIG. 14B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel area of a display device.

Figure 14C:
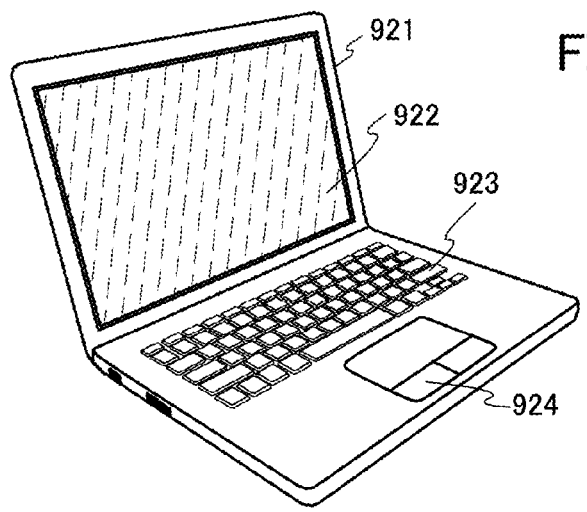

FIG. 14C illustrates a laptop personal computer including a housing 921, a display portion 922, a keyboard 923, a pointing device 924, and the like.

Figure 14D:
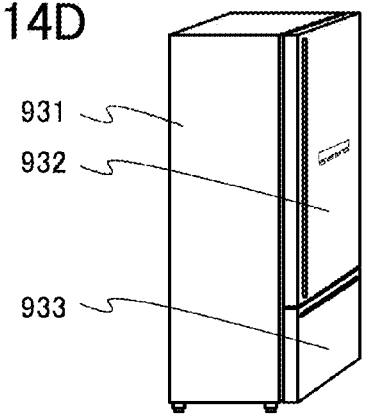

FIG. 14D illustrates an electric refrigerator-freezer including a housing 931, a door for a refrigerator 932, a door for a freezer 933, and the like.

Figure 14E:
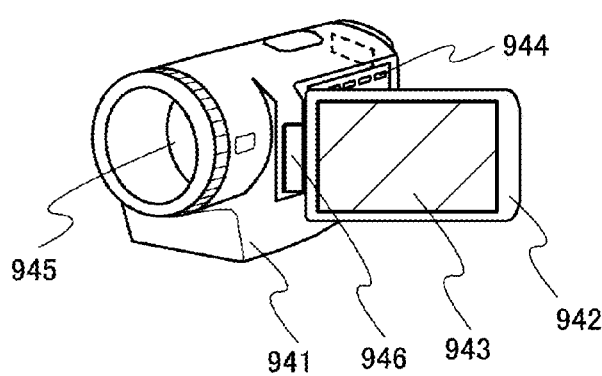

FIG. 14E illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 14F:
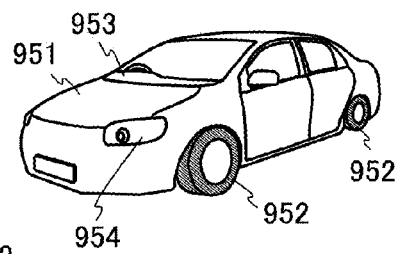
Figure 15A:
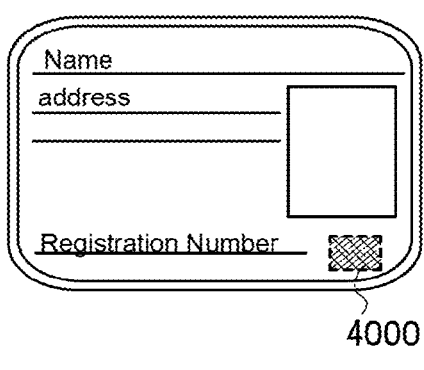
FIGS. 15A to 15F each illustrate an example of an RF tag.
Figure 15B:
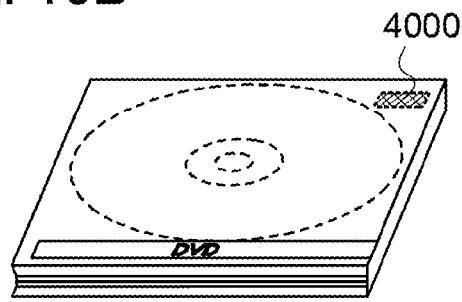
Figure 15C:
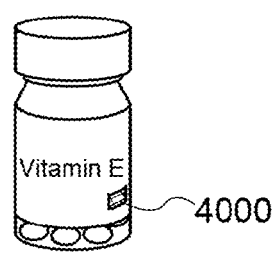
Figure 15D:
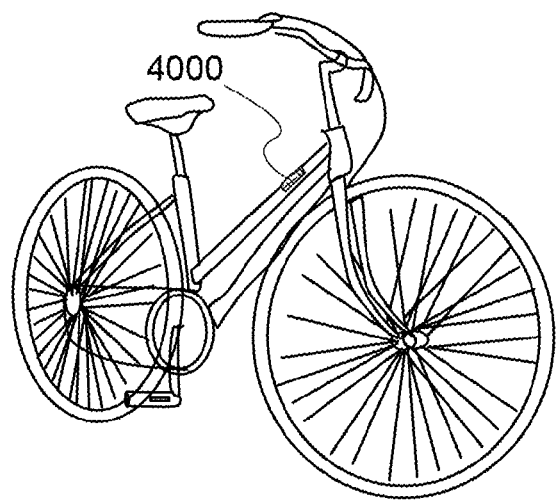
Figure 15E:
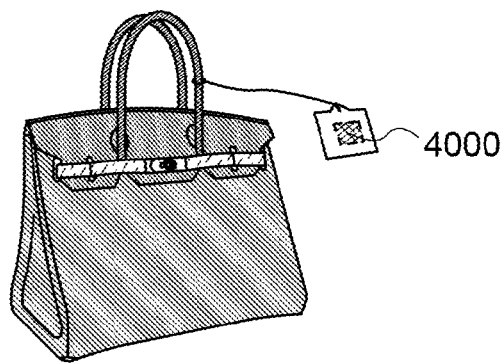
Figure 15F:
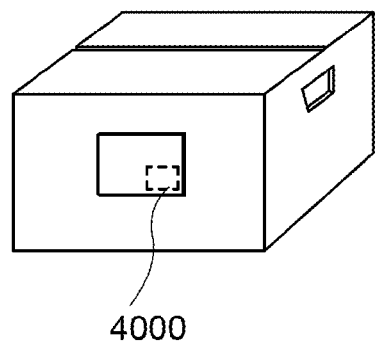

FIG. 14F illustrates a passenger car, which includes a car body 951, wheels 952, a dashboard 953, lights 954, and the like.

Note that this embodiment can be combined as appropriate with any of the other embodiments and examples in this specification.

Embodiment 8

In this embodiment, application examples of an RF tag of one embodiment of the present invention are described with reference to FIGS. 15A to 15F. The RF tag is widely used and can be provided for, for example, products such as bills, coins, securities, bearer bonds, documents (e.g., driver's licenses or resident cards, see FIG. 15A), recording media (e.g., DVDs or video tapes, see FIG. 15B), packaging containers (e.g., wrapping paper or bottles, see FIG. 15C), vehicles (e.g., bicycles, see FIG. 15D), foods, plants, animals, human bodies, clothes, personal belongings (e.g., bags or glasses), household goods, medical supplies such as medicine and chemicals, and electronic appliances (e.g., liquid crystal display devices, EL display devices, television devices, or mobile phones), or tags on products (see FIGS. 15E and 15F).

An RF tag 4000 of one embodiment of the present invention is fixed to products by being attached to a surface thereof or embedded therein. For example, the RF tag 4000 is fixed to each product by being embedded in paper of a book, or embedded in an organic resin of a package. Since the RF tag 4000 can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic appliances, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RFID can be preferably used for application in which data is not frequently written or read.

This embodiment can be combined as appropriate with any of the other embodiments and an example in this specification.

Embodiment 9

In this embodiment, a crystal structure of an oxide semiconductor film that can be used for the oxide semiconductor transistor described in the above embodiment is described.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "perpendicular" indicates that the angle formed between two straight lines is greater than or equal to $80°$ and less than or equal to $100°$, and accordingly also includes the case where the angle is greater than or equal to $85°$ and less than or equal to $95°$.

In this specification, trigonal and rhombohedral crystal systems are included in a hexagonal crystal system.

A structure of the oxide semiconductor film is described below.

An oxide semiconductor film is classified roughly into a non-single-crystal oxide semiconductor film and a single crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

Figure 20A:
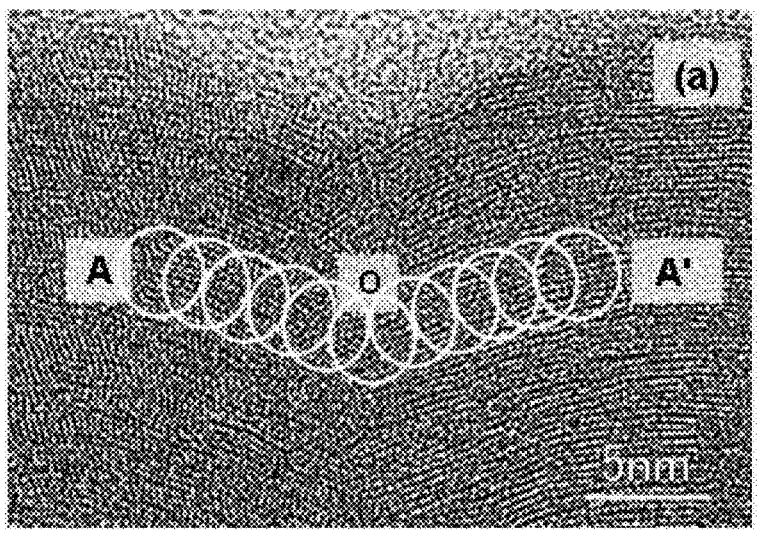
FIGS. 20A to 20C are cross-sectional TEM images and a local Fourier transform image of an oxide semiconductor.
Figure 20B:
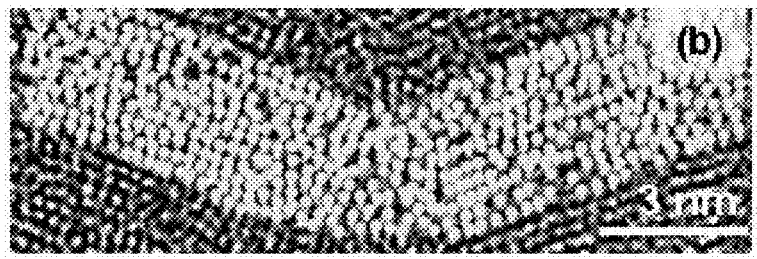

FIG. 20A is a high-resolution cross-sectional TEM image of a CAAC-OS film. FIG. 20B is a high-resolution cross-sectional TEM image obtained by enlarging the image of FIG. 20A. In FIG. 20B, atomic arrangement is highlighted for easy understanding.

Figure 20C:
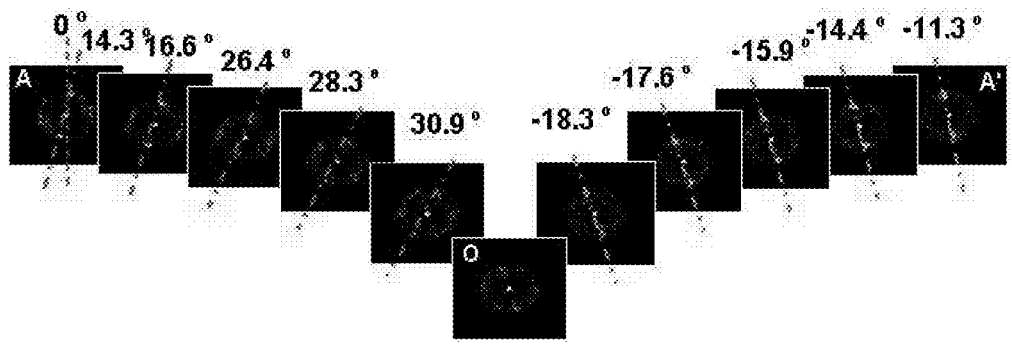

FIG. 20C is local Fourier transform images of regions each surrounded by a circle (the diameter is about 4 nm) between A and O and between O and A' in FIG. 20A. C-axis alignment can be observed in each region in FIG. 20C. The c-axis direction between A and O is different from that between O and A', which indicates that a grain in the region between A and O is different from that between O and A'. In addition, the angle of the c-axis between A and O continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) indicating alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 21A).

From the high-resolution cross-sectional TEM image and the high-resolution plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the high-resolution plan-view TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray beam is incident on a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added may be altered and the proportion of the c-axis aligned crystal parts in the CAAC-OS film might vary depending on regions.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases (see FIG. 21B).

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties intermediate between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be observed. Furthermore, in the high-resolution TEM image, there are a region where a crystal part is clearly observed and a region where a crystal part is not observed. In some cases, growth of the crystal part occurs due to the crystallization of the amorphous-like OS film, which is induced by a slight amount of electron beam employed in the TEM observation. In contrast, in the nc-OS film that has good quality, crystallization hardly occurs by a slight amount of electron beam used for TEM observation.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal. The maximum length of the region in which the lattice fringes are observed is regarded as the size of the crystal parts of the amorphous-like OS film and the nc-OS film. Note that the crystal part whose size is 0.8 nm or larger is selectively evaluated.

Figure 22:
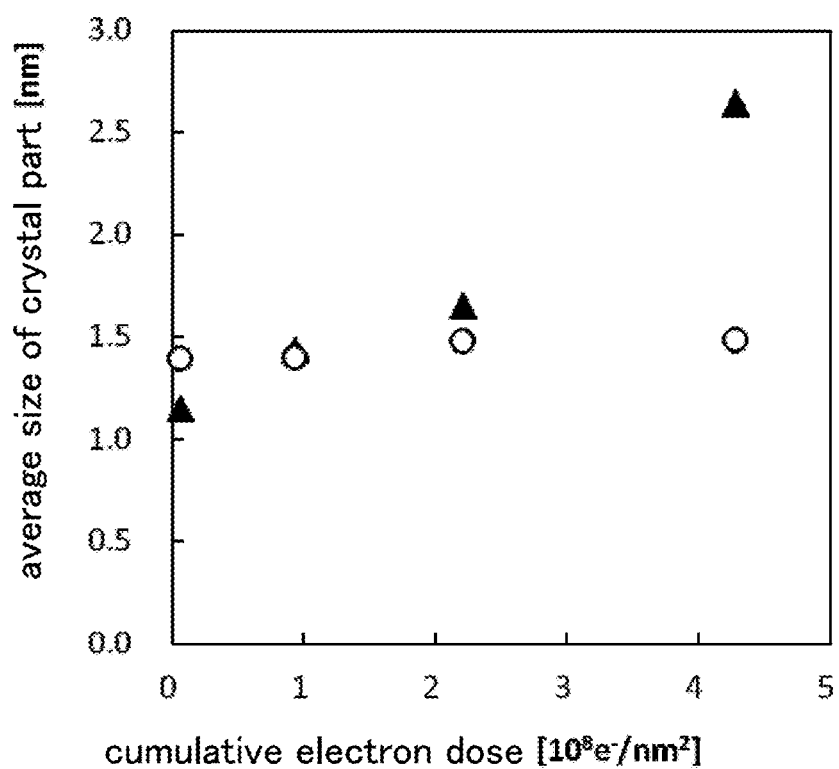
FIG. 22 shows a change in crystal part induced by electron irradiation.

FIG. 22 shows examination results of change in average size of crystal parts (20-40 points) in the amorphous-like OS film and the nc-OS film using the high-resolution TEM images. FIG. 22 indicates that the crystal part size in the amorphous-like OS film increases with an increase in the cumulative electron dose. Specifically, the crystal part of approximately 1.2 nm at the start of TEM observation grows to a size of approximately 2.6 nm at a cumulative electron dose of $4.2 \times 10^8$ $e^-/nm^2$. In contrast, the crystal part size in the good-quality nc-OS film shows little change from the start of electron irradiation to a cumulative electron dose of $4.2 \times 10^8$ $e^-/nm^2$ regardless of the cumulative electron dose.

Furthermore, in FIG. 22, by linear approximation of the change in the crystal part size in the amorphous-like OS film and the nc-OS film and extrapolation to a cumulative electron dose of 0 $e^-/nm^2$, the average size of the crystal part is found to have a positive value. This means that the crystal parts exist in the amorphous-like OS film and the nc-OS film before TEM observation.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 21A:
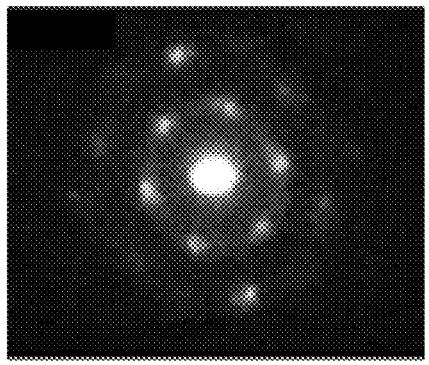
FIGS. 21A and 21B show nanobeam electron diffraction patterns of oxide semiconductor films.
Figure 21B:
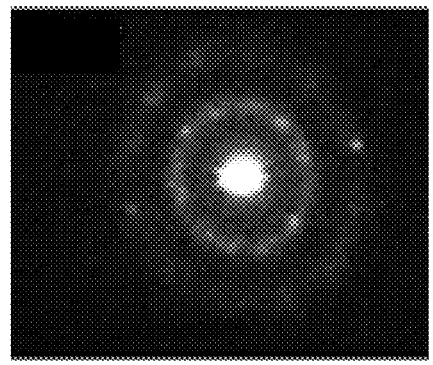
Figure 21C:
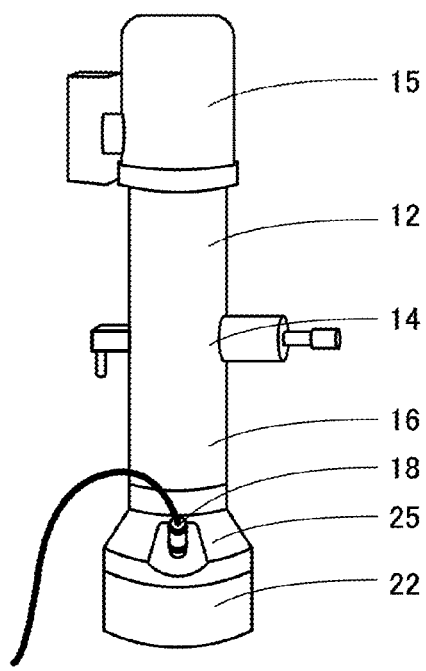
FIGS. 21C and 21D illustrate an example of a transmission electron diffraction measurement apparatus.

FIG. 21C illustrates a transmission electron diffraction measurement apparatus which includes an electron gun chamber 15, an optical system 12 below the electron gun chamber 15, a sample chamber 14 below the optical system 12, an optical system 16 below the sample chamber 14, an observation chamber 25 below the optical system 16, a camera 18 installed in the observation chamber 25, and a film chamber 22 below the observation chamber 25. The camera 18 is provided to face toward the inside of the observation chamber 25. Note that the film chamber 22 is not necessarily provided.

Figure 21D:
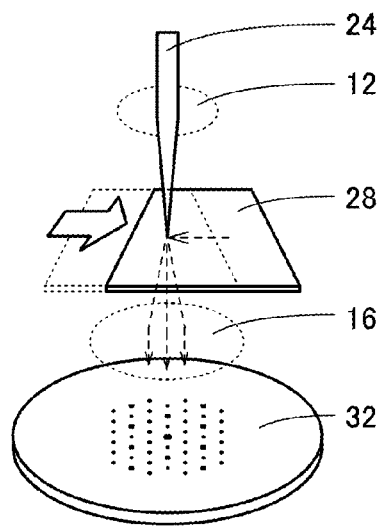

FIG. 21D illustrates an internal structure of the transmission electron diffraction measurement apparatus illustrated in FIG. 21C. In the transmission electron diffraction measurement apparatus, a substance 28 which is positioned in the sample chamber 14 is irradiated with electrons emitted from an electron gun installed in the electron gun chamber 15 through the optical system 12. Electrons passing through the substance 28 are incident on a fluorescent plate 32 provided in the observation chamber 25 through the optical system 16. On the fluorescent plate 32, a pattern corresponding to the intensity of the incident electrons appears, which allows measurement of a transmission electron diffraction pattern.

The camera 18 is installed so as to face the fluorescent plate 32 and can take an image of a pattern appearing on the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 p.m. The range is preferably determined to be an optimal range for the structure of the substance 28.

Then, a method for measuring a transmission electron diffraction pattern of a substance by the transmission electron diffraction measurement apparatus described above will be described.

For example, changes in the structure of a substance can be observed by changing the irradiation position of the electrons 24 that are a nanobeam on the substance (or by scanning) as illustrated in FIG. 21D. At this time, when the substance 28 is a CAAC-OS film, a diffraction pattern shown in FIG. 21A is observed. When the substance 28 is an nc-OS film, a diffraction pattern shown in FIG. 21B is observed.

Even when the substance 28 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high-quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 23A:
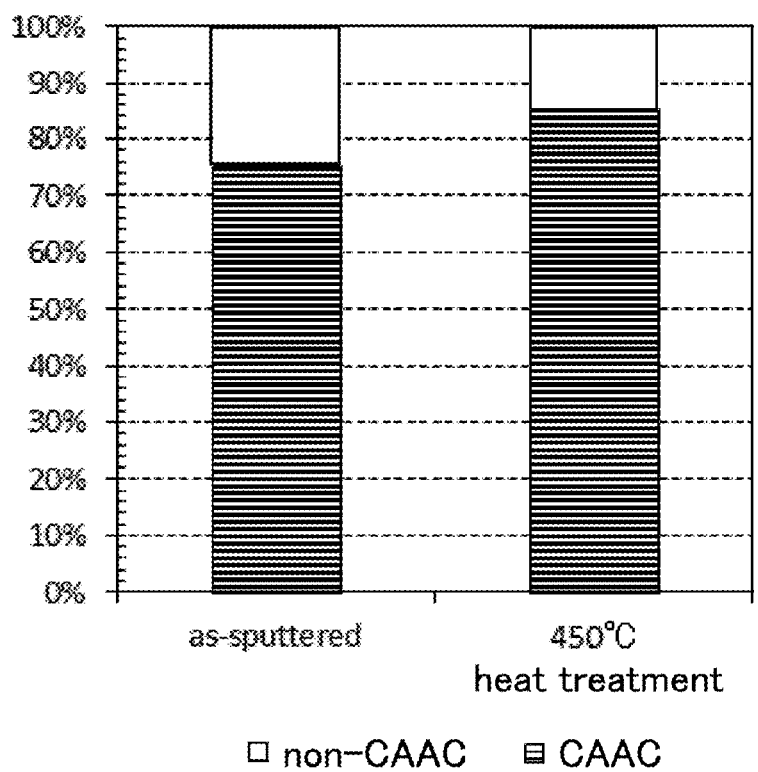
FIG. 23A shows an example of structural analysis by transmission electron diffraction measurement.

FIG. 23A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 23B:
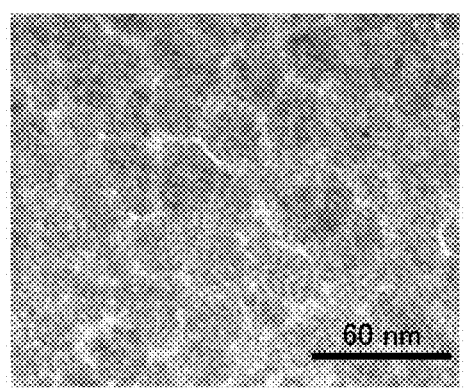
FIGS. 23B and 23C are plan-view TEM images.
Figure 23C:
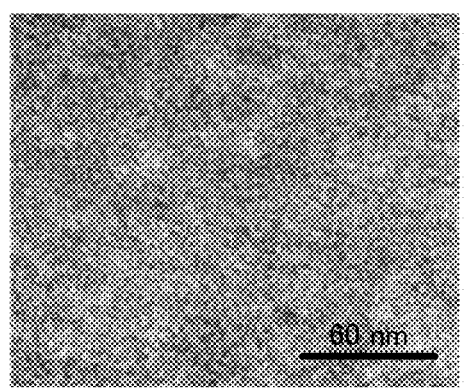

FIGS. 23B and 23C are high-resolution plan-view TEM images of the CAAC-OS film obtained just after the deposition and the CAAC-OS film subjected to the heat treatment at 450° C., respectively. Comparison between FIGS. 23B and 23C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

This embodiment can be combined as appropriate with any of the other embodiments and an example in this specification.

Example 1

In this example, SPICE simulation was performed on each of the semiconductor device 10 in FIG. 1 and the semiconductor device 10a in FIG. 2, and an effect of the semiconductor device 10a is described.

Figure 16A:
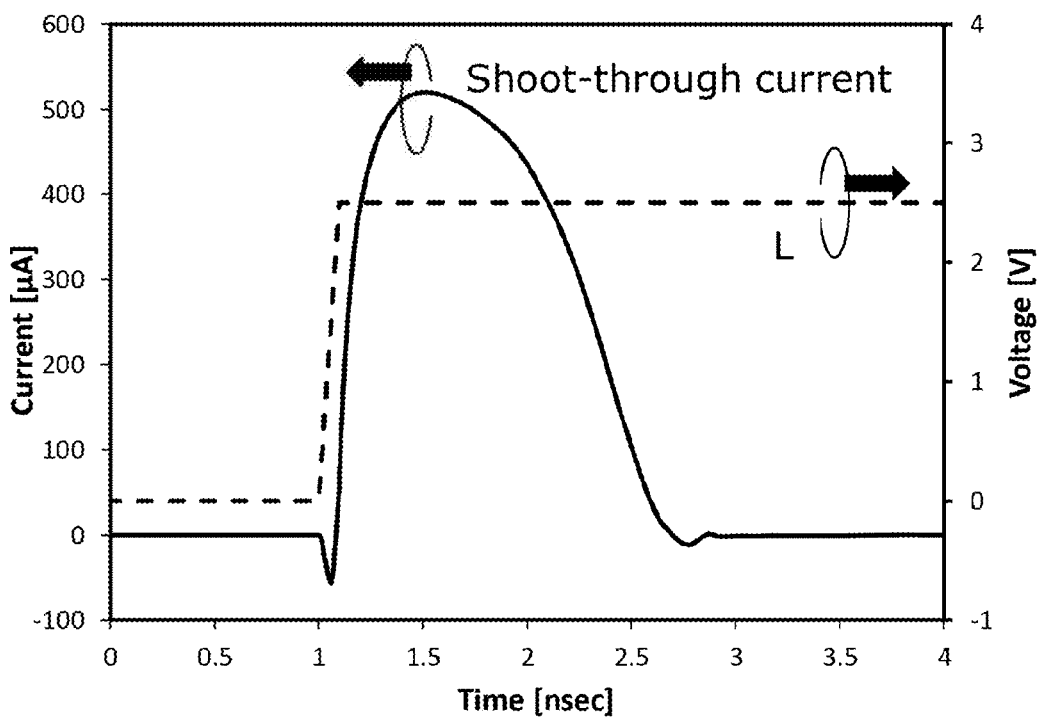
FIGS. 16A and 16B show results of SPICE simulation performed on semiconductor devices.

FIG. 16A shows changes over time in potential of the control signal Load (L in FIG. 16A) and in shoot-through current flowing through the inverter circuit 101 in the semiconductor device 10 in FIG. 1 at the time of data restoration from the memory circuit 120 to the memory circuit 100.

Figure 16B:
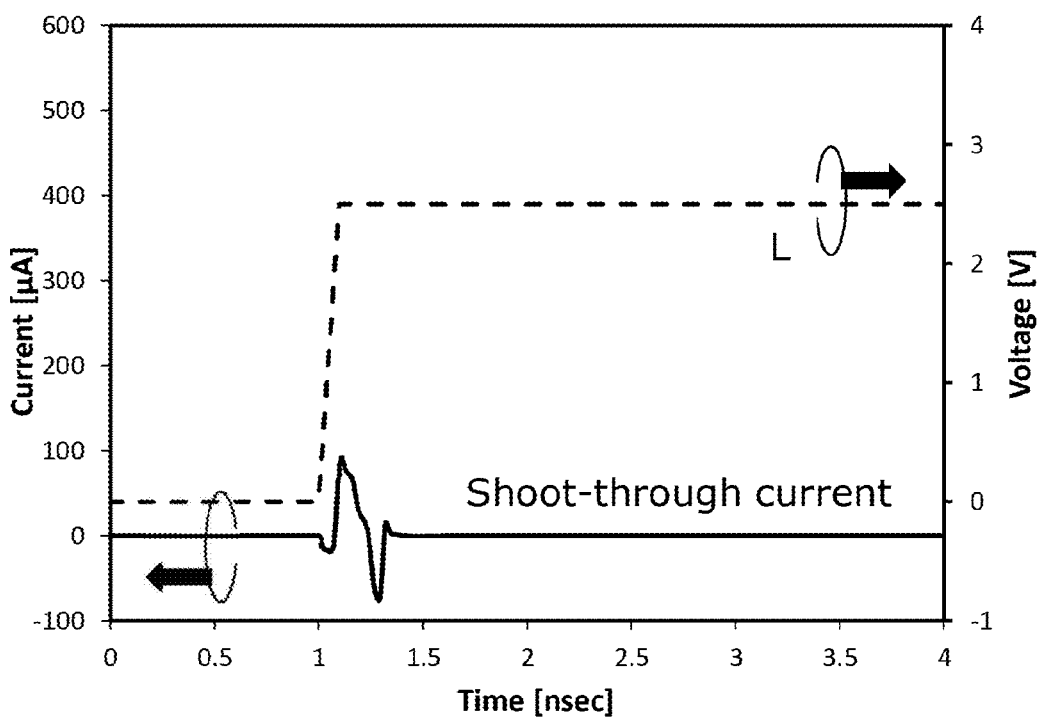

Like FIG. 16A, FIG. 16B shows changes over time in potential of the control signal Load (L in FIG. 16B) and in shoot-through current flowing through the inverter circuit 101 in the semiconductor device 10*a* in FIG. 2 at the time of data restoration from the memory circuit 120 to the memory circuit 110.

According to FIGS. 16A and 16B, the control signal Load has an L-level potential in the initial state (Time 0 sec). The nodes Node_1, Node_2, Node_3, and Node_4 are supplied with an L-level potential, an H-level potential, an H-level potential, and an L-level potential, respectively.

FIGS. 16A and 16B demonstrate that shoot-through current is generated when the potential of the control signal Load is changed from L level to H level.

A comparison between FIGS. 16A and 16B demonstrates that the semiconductor device 10*a* has less shoot-through current than the semiconductor device 10. The reason is as follows: in the semiconductor device 10*a*, the transistor 106 or 107 is turned off so that a path of shoot-through current is blocked when the potential of the control signal Load becomes H level, as described in Embodiment 1. Note that a small amount of shoot-through current, which is observed in FIG. 16B, is generated because data restoration is started before the transistor 106 or 107 is turned off, and the shoot-through current can be further reduced by controlling the timings of turning off the transistor 106 or 107 and the data restoration.

FIGS. 16A and 16B demonstrate that the semiconductor device 10*a* in FIG. 2 has a small amount of shoot-through current and low power consumption.

Figure 17A:
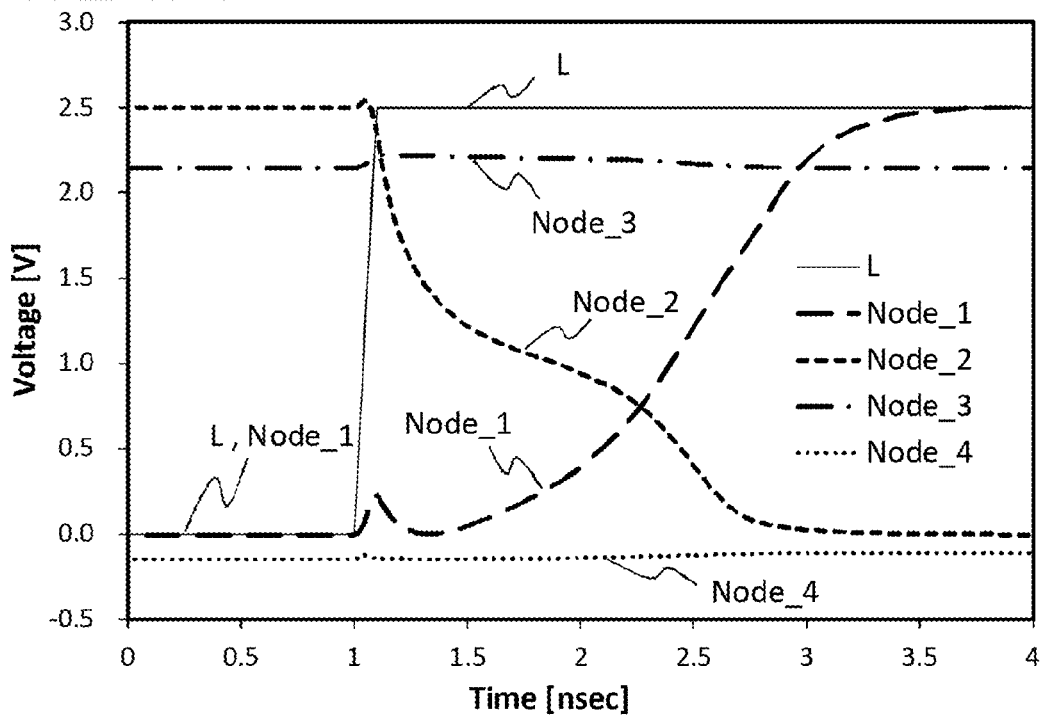
FIGS. 17A and 17B show results of SPICE simulation performed on semiconductor devices.

FIG. 17A shows changes over time in potential of the control signal Load (L in FIG. 17A) and the nodes Node_1, Node_2, Node_3, and Node_4 in the semiconductor device 10 in FIG. 1 at the time of data restoration from the memory circuit 120 to the memory circuit 100.

Figure 17B:
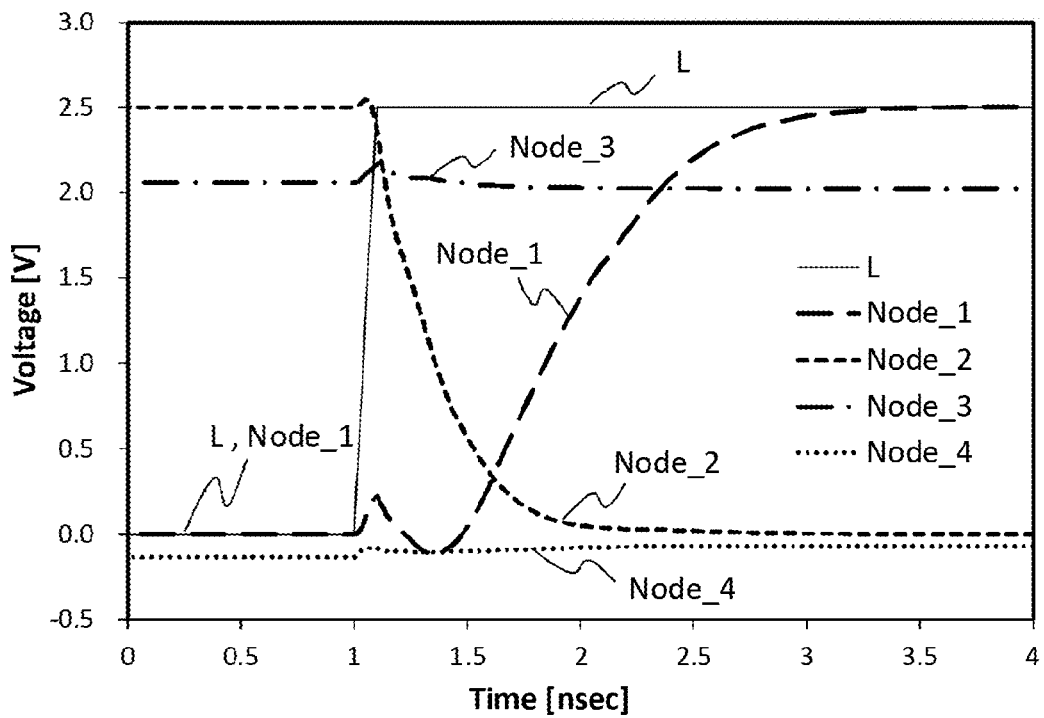

Like FIG. 17A, FIG. 17B shows changes over time in potential of the control signal Load (L in FIG. 17B) and the nodes Node_1, Node_2, Node_3, and Node_4 in the semiconductor device 10*a* in FIG. 2 at the time of data restoration from the memory circuit 120 to the memory circuit 110.

According to FIGS. 17A and 17B, the control signal Load has an L-level potential in the initial state (Time 0 sec). The nodes Node_1, Node_2, Node_3, and Node_4 are supplied with an L-level potential, an H-level potential, an H-level potential, and an L-level potential, respectively. By setting the potential of the control signal Load at H level, data restoration from the nodes Node_3 and Node_4 to the nodes Node_1 and Node_2 is started, so that the potential of the node Node_1 is changed to H level and the potential of the node Node_2 is changed to L level.

A comparison between FIGS. 17A and 17B demonstrates that data restoration in the semiconductor device 10*a* is quicker than that in the semiconductor device 10. This is because the semiconductor device 10*a* has a small amount of shoot-through current in the data restoration, and electric charges are stably supplied to the nodes Node_1 and Node_2. In contrast, the semiconductor device 10 has a large amount of shoot-through current in the data restoration, and electric charges are not stably supplied to the nodes Node_1 and Node_2. This causes an increase in the length of time for which the nodes are at intermediate potentials, so that potential transition requires a long time.

FIGS. 17A and 17B demonstrate that the semiconductor device 10*a* in FIG. 2 is capable of restoring data in a short time.

Thus, the semiconductor device of one embodiment of the present invention suppresses operation delay due to stop and restart of the supply of a power supply potential.

This application is based on Japanese Patent Application serial no. 2014-044810 filed with Japan Patent Office on Mar. 7, 2014, the entire contents of which are hereby incorporated by reference.

What is claimed is:

1. A semiconductor device comprising:
   first to third circuits,
   wherein the first circuit comprises first and second nodes, first and second transistors, and first and second wirings,
   wherein the second circuit comprises third to eighth transistors, third to fourth nodes, and a third wiring,
   wherein the third circuit comprises first and second NAND circuits and first and second inverter circuits,
   wherein the first node is capable of holding one of a first potential and a second potential,
   wherein the second node is capable of holding the other of the first potential and the second potential,
   wherein the first transistor is capable of controlling electrical continuity between the second node and the first wiring,
   wherein the second transistor is capable of controlling electrical continuity between the first node and the second wiring,
   wherein the first and second wirings are supplied with the first potential,
   wherein the first node is electrically connected to the third node via the third transistor,
   wherein the first node is electrically connected to the third wiring via the seventh and eighth transistors,
   wherein the second node is electrically connected to the fourth node via the sixth transistor,
   wherein the second node is electrically connected to the third wiring via the fourth and fifth transistors,
   wherein a gate of the fourth transistor is electrically connected to the third node,
   wherein a gate of the seventh transistor is electrically connected to the fourth node,
   wherein a first signal is input to a gate of the fifth transistor and a gate of the eighth transistor,
   wherein the third wiring is supplied with the second potential,
   wherein the first signal is input to a first input terminal of the first NAND circuit,
   wherein a second input terminal of the first NAND circuit is electrically connected to the third node,
   wherein an output terminal of the first NAND circuit is electrically connected to a gate of the first transistor via the first inverter circuit,
   wherein the first signal is input to a first input terminal of the second NAND circuit,
   wherein a second input terminal of the second NAND circuit is electrically connected to the fourth node,
   wherein an output terminal of the second NAND circuit is electrically connected to a gate of the second transistor via the second inverter circuit, and
   wherein the third and sixth transistors each comprise an oxide semiconductor in a channel formation region.

2. The semiconductor device according to claim 1,
   wherein the third node is capable of holding the potential supplied to the first node while a supply of a power supply potential to the first to third circuits is stopped, and wherein the fourth node is capable of holding the potential supplied to the second node while the supply of the power supply potential to the first to third circuits is stopped.

3. An electronic appliance comprising:
the semiconductor device according to claim 2; and
at least one of a display device, a microphone, a speaker, an operation key, and a housing.

4. An electronic appliance comprising:
the semiconductor device according to claim 1; and
at least one of a display device, a microphone, a speaker, an operation key, and a housing.

5. A semiconductor device comprising:
first to third circuits,
wherein the first circuit comprises first and second nodes, first and second transistors, and first and second wirings,
wherein the second circuit comprises first and second inverter circuits, third to eighth transistors, third to fourth nodes, and a third wiring,
wherein the third circuit comprises first and second NAND circuits and third and fourth inverter circuits,
wherein the first node is capable of holding one of a first potential and a second potential,
wherein the second node is capable of holding the other of the first potential and the second potential,
wherein the first transistor is capable of controlling electrical continuity between the second node and the first wiring,
wherein the second transistor is capable of controlling electrical continuity between the first node and the second wiring,
wherein the first and second wirings are supplied with the first potential,
wherein the first node is electrically connected to the third node via the first inverter circuit and the third transistor,
wherein the first node is electrically connected to the third wiring via the fourth and fifth transistors,
wherein the second node is electrically connected to the fourth node via the second inverter circuit and the sixth transistor,
wherein the second node is electrically connected to the third wiring via the seventh and eighth transistors,
wherein a gate of the fourth transistor is electrically connected to the third node,
wherein a gate of the seventh transistor is electrically connected to the fourth node,
wherein a first signal is input to a gate of the fifth transistor and a gate of the eighth transistor,
wherein the third wiring is supplied with the second potential,
wherein the first signal is input to a first input terminal of the first NAND circuit,
wherein a second input terminal of the first NAND circuit is electrically connected to the fourth node,
wherein an output terminal of the first NAND circuit is electrically connected to a gate of the first transistor via the third inverter,
wherein the first signal is input to a first input terminal of the second NAND circuit,
wherein a second input terminal of the second NAND circuit is electrically connected to the third node,
wherein an output terminal of the second NAND circuit is electrically connected to a gate of the second transistor via the fourth inverter circuit, and
wherein the third and sixth transistors each comprise an oxide semiconductor in a channel formation region.

6. The semiconductor device according to claim 5,
wherein the third node is capable of holding the potential supplied to the second node while a supply of a power supply potential to the first to third circuits is stopped, and
wherein the fourth node is capable of holding the potential supplied to the first node while the supply of the power supply potential to the first to third circuits is stopped.

7. An electronic appliance comprising:
the semiconductor device according to claim 6; and
at least one of a display device, a microphone, a speaker, an operation key, and a housing.

8. An electronic appliance comprising:
the semiconductor device according to claim 5; and
at least one of a display device, a microphone, a speaker, an operation key, and a housing.

* * * * *